(12) United States Patent
Campbell et al.

(10) Patent No.: US 11,146,067 B2
(45) Date of Patent: Oct. 12, 2021

(54) LINE CONTROL CIRCUIT CONFIGURATION

(71) Applicant: Hatch Ltd., Mississauga (CA)

(72) Inventors: Michael Morgan Campbell, Toronto (CA); Yan Elksnis, Toronto (CA); Dong Shen, Toronto (CA)

(73) Assignee: Hatch Ltd., Mississauga (CA)

( * ) Notice: Subject to any disclaimer, the term of this patent is extended or adjusted under 35 U.S.C. 154(b) by 287 days.

(21) Appl. No.: 16/176,528

(22) Filed: Oct. 31, 2018

(65) Prior Publication Data

US 2019/0131791 A1  May 2, 2019

Related U.S. Application Data

(60) Provisional application No. 62/579,489, filed on Oct. 31, 2017.

(51) Int. Cl.
| | |
|---|---|
| *H05B 7/148* | (2006.01) |
| *H02J 3/18* | (2006.01) |
| *H03K 17/72* | (2006.01) |
| *H05B 7/18* | (2006.01) |
| *H02J 3/00* | (2006.01) |

(52) U.S. Cl.
CPC ............. *H02J 3/18* (2013.01); *H02J 3/1807* (2013.01); *H02J 3/1892* (2013.01); *H03K 17/72* (2013.01); *H05B 7/18* (2013.01); *H02J 3/002* (2020.01)

(58) Field of Classification Search
CPC ...... H02J 3/00; H02J 3/002; H02J 3/18; H02J 3/1807; H02J 3/1821; H02J 3/1828; H02J 3/1864; H02J 3/1892; H02J 2003/002; H05B 7/005; H05B 7/144; H05B 7/148; H05B 7/156; H05B 7/18; H03K 17/72; Y02E 40/12; Y02E 40/10; Y02E 40/30
USPC ...... 373/47, 60, 70, 102, 104, 108, 147, 148
See application file for complete search history.

(56) References Cited

U.S. PATENT DOCUMENTS

| 3,936,727 A | 2/1976 | Kelley, Jr. et al. |
| 5,991,327 A * | 11/1999 | Kojori ................... C21C 5/5211 373/104 |
| 6,573,691 B2 | 6/2003 | Ma et al. |
| (Continued) | | |

FOREIGN PATENT DOCUMENTS

| CN | 104734161 B | 6/2015 |
| DE | 102013227190 | 7/2015 |

OTHER PUBLICATIONS

Office Action and English Translation thereof; Republic of Colombia; NC2018/0011768 dated Mar. 19, 2021.
(Continued)

*Primary Examiner* — Hung D Nguyen
(74) *Attorney, Agent, or Firm* — Ridout and Maybee LLP

(57) ABSTRACT

A configuration of switches added to a line control circuit allows for switching back and forth between a configuration featuring a series-connected thyristor switch and reactor and a configuration featuring a parallel-connected thyristor switch and reactor. Connecting the reactor in series with the thyristor switch allows a controlled high-impedance circuit configuration that is particularly well adapted for cold furnace start-ups and furnace idling. In this manner, there is reduced need for such equipment as extra startup transformers, alternate low-voltage power supply configurations and temporary specialty electrical apparatus for cold furnace start-ups.

19 Claims, 19 Drawing Sheets

(56) References Cited

U.S. PATENT DOCUMENTS

| | | | |
|---|---|---|---|
| 8,665,924 B2 | 3/2014 | Koenig et al. | |
| 2003/0076075 A1* | 4/2003 | Ma | H02J 3/1864 |
| | | | 323/209 |
| 2006/0083286 A1 | 4/2006 | Sedighy et al. | |
| 2008/0056327 A1* | 3/2008 | Gerritsen | F27D 19/00 |
| | | | 373/102 |
| 2008/0123714 A1* | 5/2008 | Konig | H05B 7/005 |
| | | | 373/104 |
| 2010/0109616 A1* | 5/2010 | Li | G05F 1/70 |
| | | | 323/210 |
| 2014/0177668 A1* | 6/2014 | Aho | H02J 3/00 |
| | | | 373/104 |

OTHER PUBLICATIONS

Office Action and English Translation thereof; Republic of Indonesia; P00201808778 dated Apr. 6, 2021.
International Search Report and Written Opinion; PCT/CA2018/051359 dated Jan. 31, 2019.

* cited by examiner

US 11,146,067 B2

LINE CONTROL CIRCUIT CONFIGURATION

CROSS-REFERENCE TO RELATED APPLICATIONS

The present application claims priority to U.S. Provisional Patent Application No. 62/579,489, filed Oct. 21, 2017, the contents of which are hereby incorporated herein by reference.

FIELD

The present application relates generally to electric arc furnaces and, more specifically, to reconfiguring line control circuit configuration for such furnaces.

BACKGROUND

An electric arc furnace is a device in which charged material may be heated by means of an electric arc. Electric arc furnaces are used in a variety of applications in a wide range of scales, from a few dozen grams to hundreds of tons. One application for electric arc furnaces is secondary steelmaking. Another application is the smelting of non-ferrous ores. The latter is often termed a shielded arc smelting application of electric arc furnaces.

An Alternating Current (AC) electric arc furnace uses a furnace transformer to deliver power from a power grid to an arc at two or more electrode tips. A Direct Current (DC) electric arc furnace uses a rectifier transformer and a rectifier to deliver power from the power grid to an arc at one or more electrode tips.

As will be understood by those of skill in the art, a given electric arc furnace can operate in different modes. These modes include open arc, shielded arc and submerged arc.

In the steelmaking application, variations in the load experienced by the power grid that supplies electricity to the electric arc furnace give rise to something called "power grid flicker." Unfortunately, power grid flicker can be shown to cause malfunction in sensitive lighting. Furthermore, power grid flicker can be shown to disturb other consumers on the same power grid. Even further, excessive power grid flicker can violate an electricity contract entered into by the operator of the electric arc furnace.

BRIEF DESCRIPTION OF THE DRAWINGS

Reference will now be made, by way of example, to the accompanying drawings which show example implementations; and in which.

DETAILED DESCRIPTION

Traditionally, power grid flicker (or, simply, "flicker") may be mitigated by installing shunt reactive power compensation equipment. Examples of reactive power compensation equipment include a traditional Static VAR Compensator (SVC) or a more advanced power converter based Static Synchronous Compensator (STATCOM). Another proven technology for flicker reduction is a Smart Predictive Line Controller (SPLC), which may be connected in series with a fluctuating load. For an example of a known flicker reduction strategy, see U.S. Pat. No. 6,573,691, the contents of which are hereby included herein by reference.

In electric power transmission and distribution, volt-ampere reactive (VAR) is a unit in which reactive power is expressed in an Alternating Current (AC) electric power system. Reactive power exists in an AC circuit when the current and voltage are not in phase.

An SVC consists of a shunt-connected harmonic filter bank and a shunt-connected thyristor-controlled reactor. The filter bank and the thyristor-controlled reactor operate in concert to lower voltage flicker or maintain a constant furnace power factor. The SVC operates by shunt injection of either capacitive or inductive reactive power, thereby maintaining a constant voltage by maintaining the total reactive power draw (MVAR) of the furnace balanced near zero (i.e., neither inductive or capacitive). SVCs typically have a half cycle time delay due to thyristor commutation requirements. An example of an early SVC can be seen in U.S. Pat. No. 3,936,727.

SVC-based arc furnace controllers dynamically supply reactive power by the controlled summation of constant capacitive MVAR and variable inductive MVAR. The controller compares load reactive power to a reactive power set-point derived from power factor set-point and dynamically controls the summated MVAR to the set-point. As an electric arc furnace frequently short circuits and open circuits on bore in of the furnace electrodes, the furnace reactive power swings vary from zero to 200% of the furnace transformer rating. An SVC is normally sized at 125% to 150% of the furnace rating and typically reduces flicker by approximately 40% to 50%. Some SVCs use a voltage set-point and adjust a shunt reactor to match a supply voltage to the set-point voltage.

An SPLC consists of a thyristor controlled reactor connected between the supply bus and an electrode of the electric arc furnace. An SPLC functions as a dynamically controlled series reactor that uses predictive software to stabilize the real power or the current on an electric arc furnace. The SPLC reduces flicker by lowering arc current fluctuations on the power systems. When arc current fluctuations are flat lined, the voltage flicker is reduced. An example of an SPLC can be seen in U.S. Pat. No. 5,991,327 issued Nov. 23, 1999.

Figure 1:
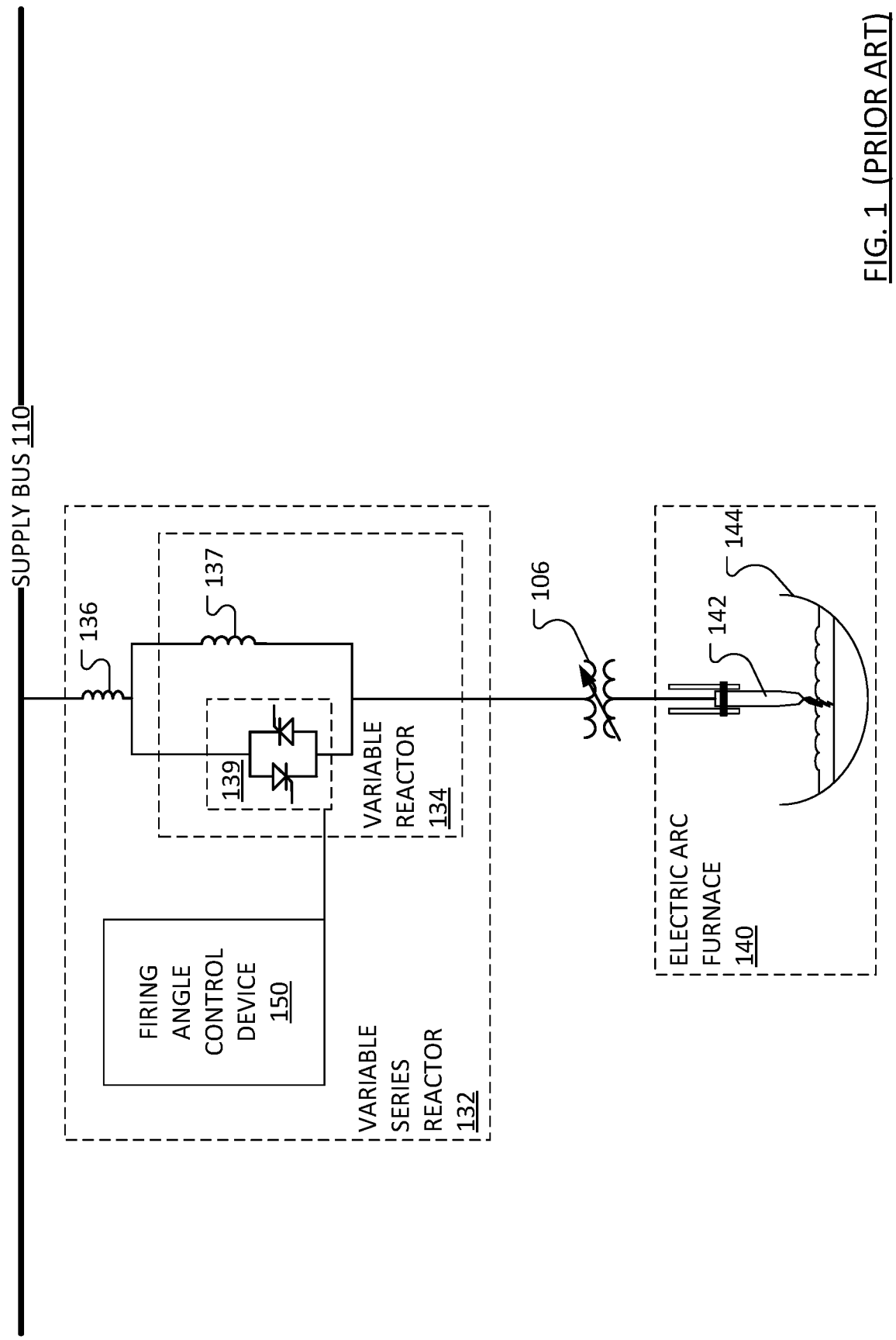
FIG. 1 illustrates a prior art system including a three phase AC electric arc furnace (with three electrodes or six electrodes, only one electrode is illustrated) in combination with flicker control in the form of a Variable Series Reactor on a primary side of a transformer.

FIG. 1 illustrates an example of a three phase AC electric arc furnace (EAF) 140. Three phase power is provided to the electric arc furnace 140 from a local supply bus 110. The supply bus 110 is connected to receive power from a utility power supply through transmission line and step down transformer (not shown) or, alternatively, from a local generating station (not shown). The electric arc furnace 140 includes three electrodes or six electrodes (arranged in three pairs) 142 (not individually illustrated), with each of the three electrodes or each of the three electrode pairs 142 being associated with one of the three power phases. Arcing ends of the electrodes 142 are positioned in a furnace vessel 144 to, for example, melt a work material, such as scrap metal, and may be mounted such that their position within the furnace vessel 144 can be adjusted. The electrodes 142 are connected to a furnace side (secondary windings) of a tapped furnace transformer 106.

A variable series reactor 132 is connected, in series with the tapped furnace transformer 106, between the electric arc furnace 140 and the supply bus 110. Each of the three phases of the variable series reactor 132 (only one phase of which is illustrated) includes a series combination of a variable reactor 134 and a fixed-value reactor 136 connecting a respective phase of a supply side (primary windings) of the furnace transformer 106 to a corresponding phase of the supply bus 110. In the illustrated embodiment, the representative variable reactor 134 includes a reactor 137 connected in parallel with a thyristor switch 139. Each thyristor switch 139 preferably includes a pair of thyristors, or pairs of thyristor groups, arranged in opposite polarity to each other. The variable series reactor 132 has a control range. The thyristor switch 139 may be considered to be a specific implementation of what may be called a power electronics static switch. The system of FIG. 1 further includes a firing angle control device 150 adapted to control the firing angle of the thyristor switch 139.

Figure 2:
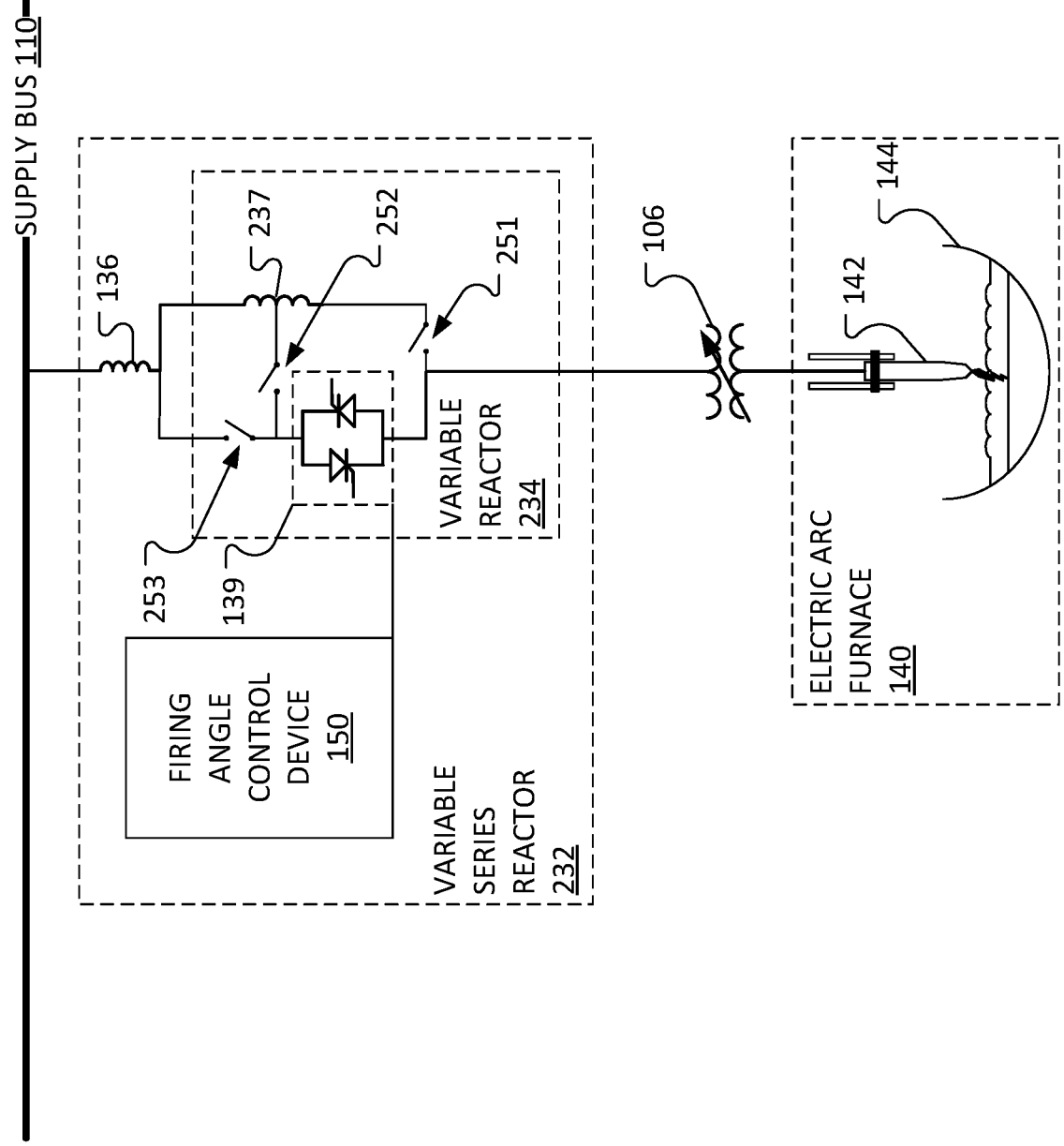
FIG. 2 illustrates the system of FIG. 1 augmented with a tapped reactor and a plurality of switches.

An innovative configuration of switches added to the system of FIG. 1, as illustrated in FIG. 2, allows for switching back and forth between a configuration featuring a series-connected thyristor switch and reactor and a configuration featuring a parallel-connected thyristor switch and reactor. Connecting the reactor in series with the thyristor switch allows a controlled high-impedance circuit configuration that is particularly well adapted for cold furnace start-ups and furnace idling. In this manner, there is reduced need for such equipment as extra startup transformers, alternate low-voltage power supply configurations and temporary specialty electrical apparatus for cold furnace start-ups.

According to an aspect of the present disclosure, there is provided a line control circuit. The line control circuit including a thyristor switch and a plurality of switches. The plurality of switches allow for switching between: a first configuration wherein a parallel combination of the thyristor switch and a first reactance is arranged in series with a second reactance; and a second configuration wherein the thyristor switch is in series with a third reactance.

According to a further aspect of the present disclosure, there is provided an adapted variable series reactor (see FIG. 2). The adapted variable series reactor includes a supply bus connection point for connecting to a phase of a supply bus having a plurality of phases, a transformer connection point for connecting to a transformer for an electrical load, a fixed-value reactor connected, at a first fixed-value reactor end, to the supply bus connection point, the fixed-value reactor having a second fixed-value reactor end, a thyristor-path switch connected, at a first thyristor-path switch end, to the second fixed-value reactor end, the thyristor-path switch having a second thyristor-path switch end, a thyristor switch connected, at a first thyristor switch end, to the second thyristor-path switch end, the thyristor switch having a second thyristor switch end connected to the transformer connection point, a tapped reactor connected, at a first tapped reactor end, to the second fixed-value reactor end, the tapped reactor having a second tapped reactor end and a tapped reactor selector, a tapped-reactor-path switch connected between the second tapped reactor end and the transformer connection point and a selector-path switch connected, at a first selector-path switch end, to the tapped reactor selector and, a second selector-path switch end, to the first thyristor switch end. The adapted variable series reactor has a first configuration defined by: the selector-path switch being an open state; the tapped-reactor-path switch being a closed state; and the thyristor-path switch being in a closed state. The adapted variable series reactor has a second configuration defined by: the selector-path switch being a closed state; the tapped-reactor-path switch being an open state; and the thyristor-path switch being in an open state.

According to another aspect of the present disclosure, there is provided a method of converting an adapted variable series reactor from a first configuration to a second configuration, the adapted variable series reactor including a supply bus connection point for connecting to a phase of a supply bus having a plurality of phases, a transformer connection point for connecting to a transformer for an electrical load, a fixed-value reactor connected, at a first fixed-value reactor end, to the supply bus connection point, the fixed-value reactor having a second fixed-value reactor end, a thyristor-path switch connected, at a first thyristor-path switch end, to the second fixed-value reactor end, the thyristor-path switch having a second thyristor-path switch end, a thyristor switch connected, at a first thyristor switch end, to the second thyristor-path switch end, the thyristor switch having a second thyristor switch end connected to the transformer connection point, a tapped reactor connected, at a first tapped reactor end, to the second fixed-value reactor end, the tapped reactor having a second tapped reactor end and a tapped reactor selector, a tapped-reactor-path switch connected between the second tapped reactor end and the transformer connection point and a selector-path switch connected, at a first selector-path switch end, to the tapped reactor selector and, a second selector-path switch end, to the first thyristor switch end. The method includes switching the selector-path switch from an open state to a closed state, switching the tapped-reactor-path switch from a closed state to an open state and switching the thyristor-path switch from a closed state to an open state.

According to still another aspect of the present disclosure, there is provided an adapted variable series reactor. The adapted variable series reactor includes a supply bus connection point for connecting to a phase of a supply bus having a plurality of phases, a transformer connection point for connecting to a transformer for an electrical load, a fixed-value reactor connected, at a first fixed-value reactor end, to the supply bus connection point, the fixed-value reactor having a second fixed-value reactor end, a thyristor-path switch connected, at a first thyristor-path switch end, to the second fixed-value reactor end, the thyristor-path switch having a second thyristor-path switch end, a thyristor switch connected, at a first thyristor switch end, to the second thyristor-path switch end, the thyristor switch having a second thyristor switch end connected to the transformer connection point, a further reactor connected, at a first further reactor end, to the second fixed-value reactor end, the further reactor having a second further reactor end, a lower switch connected between the second further reactor end and the transformer connection point and a middle switch connected, at a first middle switch end, to the second further reactor end and, at a second middle switch end, to the first thyristor switch end. The adapted variable series reactor has a first configuration defined by the middle switch being an open state, the lower switch being a closed state and the thyristor-path switch being in a closed state. The adapted variable series reactor has a second configuration defined by the middle switch being a closed state, the lower switch being an open state and the thyristor-path switch being in an open state.

According to still another aspect of the present disclosure, there is provided a method of converting an adapted variable series reactor from a first configuration to a second configuration. The adapted variable series reactor includes a supply bus connection point for connecting to a phase of a supply bus having a plurality of phases, a transformer connection point for connecting to a transformer for an electrical load, a fixed-value reactor connected, at a first fixed-value reactor end, to the supply bus connection point, the fixed-value reactor having a second fixed-value reactor end, a thyristor-path switch connected, at a first thyristor-path switch end, to the second fixed-value reactor end, the thyristor-path switch having a second thyristor-path switch end, a thyristor switch connected, at a first thyristor switch end, to the second thyristor-path switch end, the thyristor switch having a second thyristor switch end connected to the transformer connection point, a further reactor connected, at a first further reactor end, to the second fixed-value reactor end, the further reactor having a second further reactor end, a lower switch connected between the second further reactor end and the transformer connection point and a middle switch connected, at a first selector-path switch end, to the second further reactor end and, at a second middle switch end, to the first thyristor switch end. The method includes switching the middle switch from an open state to a closed state, switching the lower switch from a closed state to an open state and switching the thyristor-path switch from a closed state to an open state.

Other aspects and features of the present disclosure will become apparent to those of ordinary skill in the art upon review of the following description of specific implementations of the disclosure in conjunction with the accompanying figures.

In overview, switches in a line control circuit allow a reactor to be configured to be in series with the thyristor switch 139, in contrast to the configuration of FIG. 1, wherein the reactor 137 is connected in parallel with the thyristor switch 139. Configuring the reactor to be in series with the thyristor switch 139 allows the thyristor switch 139 to exert control of the furnace current in a range extending from nearly zero amps up to a new series high-impedance maximum. The control of the furnace current is exerted, by the firing angle control device 150, through computerized control of the firing angle of the thyristors in the thyristor switch 139. The relatively high impedance of the reactor may be seen to limit short circuit current at the furnace 140 during startup. While reducing high current conditions, the configuration wherein the reactor is in series with the thyristor switch 139 may be considered to maintain the voltage at a relatively high level.

FIG. 2 illustrates the system of FIG. 1 augmented with a tapped reactor and a plurality of switches. As illustrated in FIG. 2, aspects of the present application relate to selectively reconfiguring the circuit of FIG. 1 to a high impedance circuit configuration.

In the circuit of FIG. 2, the reactor 137 connected in parallel with the thyristor switch 139 (see FIG. 1) has been replaced by a tapped reactor 237.

The tapped reactor 237 is a device with three connection points.

Accordingly, FIG. 2 illustrates an adapted variable series reactor 232 connected, in series with the tapped furnace transformer 106, between the electric arc furnace 140 and the supply bus 110. Each of the three phases of the adapted variable series reactor 232 (only one phase of which is illustrated) includes a series combination of an adapted variable reactor 234 and the fixed-value reactor 136 connecting a respective phase of a supply side (primary windings) of the furnace transformer 106 to a corresponding phase of the supply bus 110. In the illustrated embodiment, the representative adapted variable reactor 234 includes the tapped reactor 237 connected in a switchable configuration with the thyristor switch 139. As noted hereinbefore, each phase of the thyristor switch 139 preferably includes a pair of thyristors, or pairs of thyristor groups, arranged in opposite polarity to each other. The adapted variable series reactor 232 has a control range that is based on the switchable configuration.

The adapted variable series reactor 232 has a supply bus connection point for connecting to a phase of the supply bus 110. The adapted variable series reactor 232 also has a transformer connection point for connecting to the supply side (primary windings) of the furnace transformer 106.

The referenced switchable configuration may, in one aspect of the present application, be implemented by way of three switches added to the adapted variable reactor 234.

A tapped-reactor-path switch 251 is positioned between the tapped reactor 237 and the transformer connection point of the adapted variable series reactor 232.

The tapped reactor 237 has a first connection point connected to the fixed-value reactor 136, a second connection point connected to the tapped-reactor-path switch 251 and a third connection point (a selector) connected to a selector-path switch 252. The selector-path switch 252 is positioned between the selector of the tapped reactor 237 and the supply bus side of the thyristor switch 139.

A thyristor-path switch 253 is positioned between the supply bus side of the thyristor switch 139, where the selector-path switch 252 attaches, and the fixed-value reactor 136.

Figure 3:
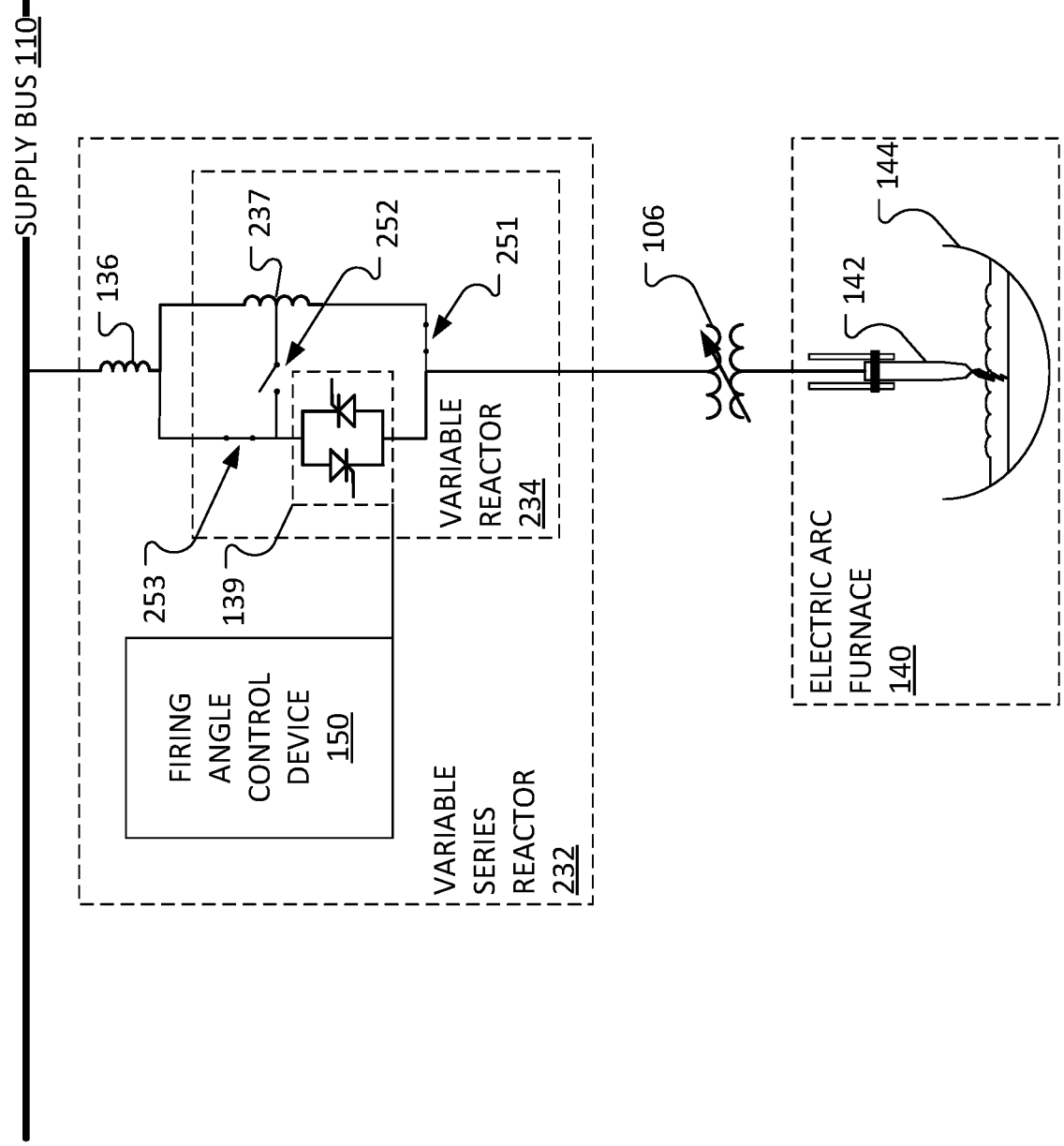
FIG. 3 illustrates the system of FIG. 2 employing a first switch configuration.

A first switch configuration, illustrated in FIG. 3, allows the adapted variable series reactor 232 to operate as a high power, high current furnace stabilizer in a manner consistent with the variable series reactor 132 of FIG. 1. In the first switch configuration, the tapped-reactor-path switch 251 is closed, the selector-path switch 252 is open and the thyristor-path switch 253 is closed. Consequently, the thyristor switch 139 operates in parallel with the tapped reactor 237.

Figure 4:
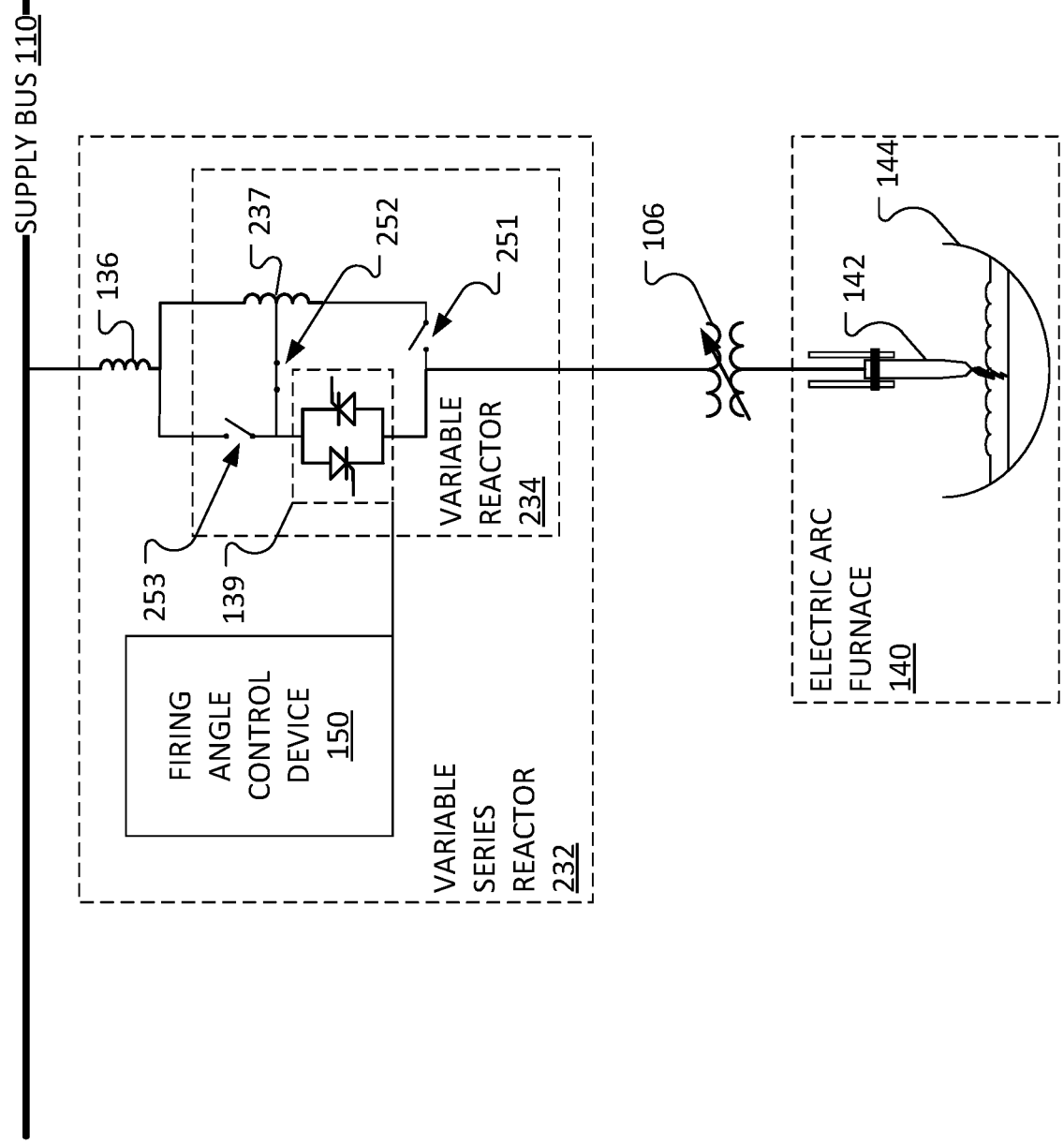
FIG. 4 illustrates the system of FIG. 2 employing a second switch configuration.

A second switch configuration, illustrated in FIG. 4, allows the adapted variable series reactor 232 to operate as a low power, low current furnace stabilizer. In the second switch configuration, the tapped-reactor-path switch 251 is open, the selector-path switch 252 is closed and the thyristor-path switch 253 is open. Consequently, the thyristor switch 139 operates in series with a selected portion of the tapped reactor 237.

Conveniently, with the adapted variable series reactor 232 in the second switch configuration, it may be considered a straightforward task to provide a relatively low and relatively well-controlled start-up current. Additionally, the adapted variable series reactor 232 in the second switch configuration may be considered to limit the current that the furnace 140 can draw in a short current situation. Consequences of this may be considered to include a reduced risk of equipment damage, a reduced start-up time and a reduction in over-current trips.

Often, a site will idle a furnace, which means keeping the furnace vessel 144 full of molten metal without releasing product to a downstream process. More particularly, the furnace vessel 144 contains feeding material (e.g., Calcine), slag and molten metal. Idling acts to maintain the furnace bath temperature (slag and molten metal). During idling, no new feeding material enters the furnace vessel 144. In secondary steelmaking, the duration of idling is usually assumed to be minutes. In ore smelting/refining furnaces, the duration of idling could range from days to weeks.

Typical furnace operation may be measured in terms of power consumption. Components of the power consumption include an arc power component, $P_{arc}$, related to creating an arc within the furnace vessel 144, and a bath power component, $P_{bath}$, related to maintaining molten metal in the furnace vessel 144.

Notably, the bath power component is related to the resistance of the bath, $R_{bath}$, by a well known relationship:

$$P_{bath} = I^2 R_{bath}$$

Where the current to the electrode 142 is represented by I. Similarly, the arc power component is related to the resistance of the arc, $R_{arc}$, by a well known relationship:

$$P_{arc} = I^2 R_{arc}$$

I is known to depend on voltage, $R_{bath}$ and $R_{arc}$.

Ideally, when the furnace 140 is idling, no arcing takes place. Notably, when idling the furnace 140, none of the molten metal is allowed to leave the furnace vessel 144 and no new material is melted, by arcing from the electrode 142. Accordingly, the resistance of the bath, $R_{bath}$ remains fixed.

When it is desired to idle the furnace 140, it follows that, to maintain molten metal in the furnace vessel 144, the bath power component is non-zero.

Traditionally, it has been considered that, when idling, $R_{arc}$ must be >0 so that I is right for $P_{bath}$. It may be considered that that I is "right" for $P_{bath}$, then I is sufficient to prevent the molten metal in the furnace vessel 144 from freezing/solidifying in the furnace vessel 144. The molten metal is to be kept molten at all times, so the optimal power, which may be found through experimentation, is sufficiently high to prevent the molten metal from solidifying, but not so high as to waste energy in the form of excess heat or an arc. However, maintaining $R_{arc} > 0$ may be considered to waste power in the arc. Such wasted power consequently wastes electricity drawn from the supply bus, which is measurable in terms of money. If a power, $P_{loss}$, lost to ambient cooling of the molten metal is known, then an estimate of I may be found that satisfies $$I = \sqrt{\frac{P_{loss}}{R_{bath}}}.$$

The adapted variable series reactor 232 in the second switch configuration, allows $R_{arc} = 0$ while the adapted variable series reactor 232 still meets I specifications for idling.

Maintaining bath power may be considered to prevent the molten metal from cooling and solidifying. Unfortunately, when the molten metal in the bath cools and solidifies, parts of the furnace may require replacement.

At a system level, the function of the firing angle control device 150 may be considered to be similar in the configuration of FIG. 1 and the configuration of FIG. 2. Where FIG. 2 allows for an operator to elect to operate the furnace 140 in either of current control mode or power control mode. The operator would select set points for current or power based on idle or production requirements. Internally, the firing angle control device 150 designed with a different set of calculations and criteria to achieve the configuration illustrated in FIG. 4 safely and reliably. The operator may base configuration on a maximum circuit voltage line-to-line, a three-phase conduction window and boundary conditions on acceptable firing angle ranges that are distinct from firing angle ranges used when operating in the configuration illustrated in FIG. 3.

Figure 5:
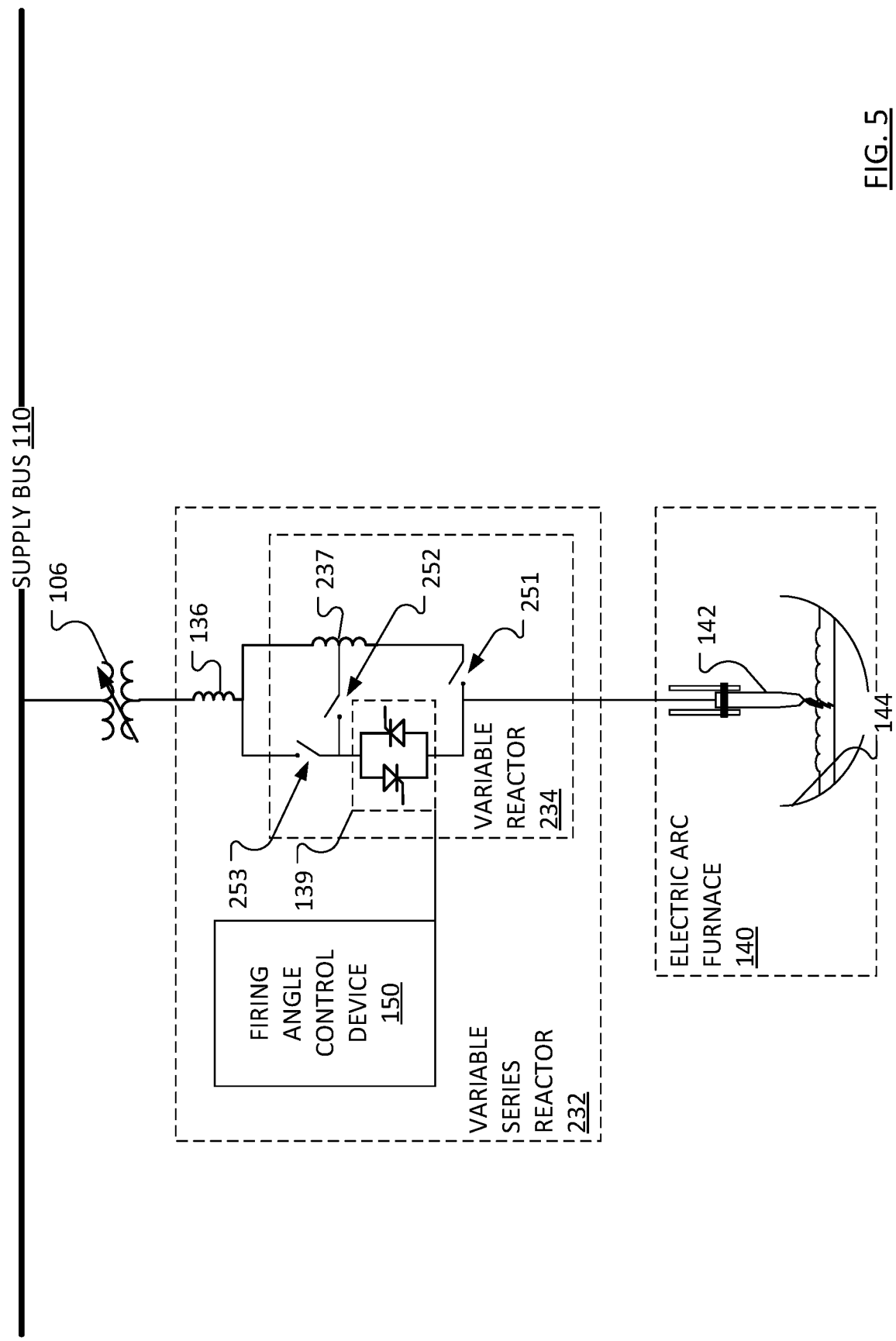
FIG. 5 illustrates the system of FIG. 2 with the Variable Series Reactor on a secondary side of the transformer.

FIG. 5 illustrates the system of FIG. 2 with the variable series reactor 232 on a secondary side of the furnace transformer 106.

Figure 6:
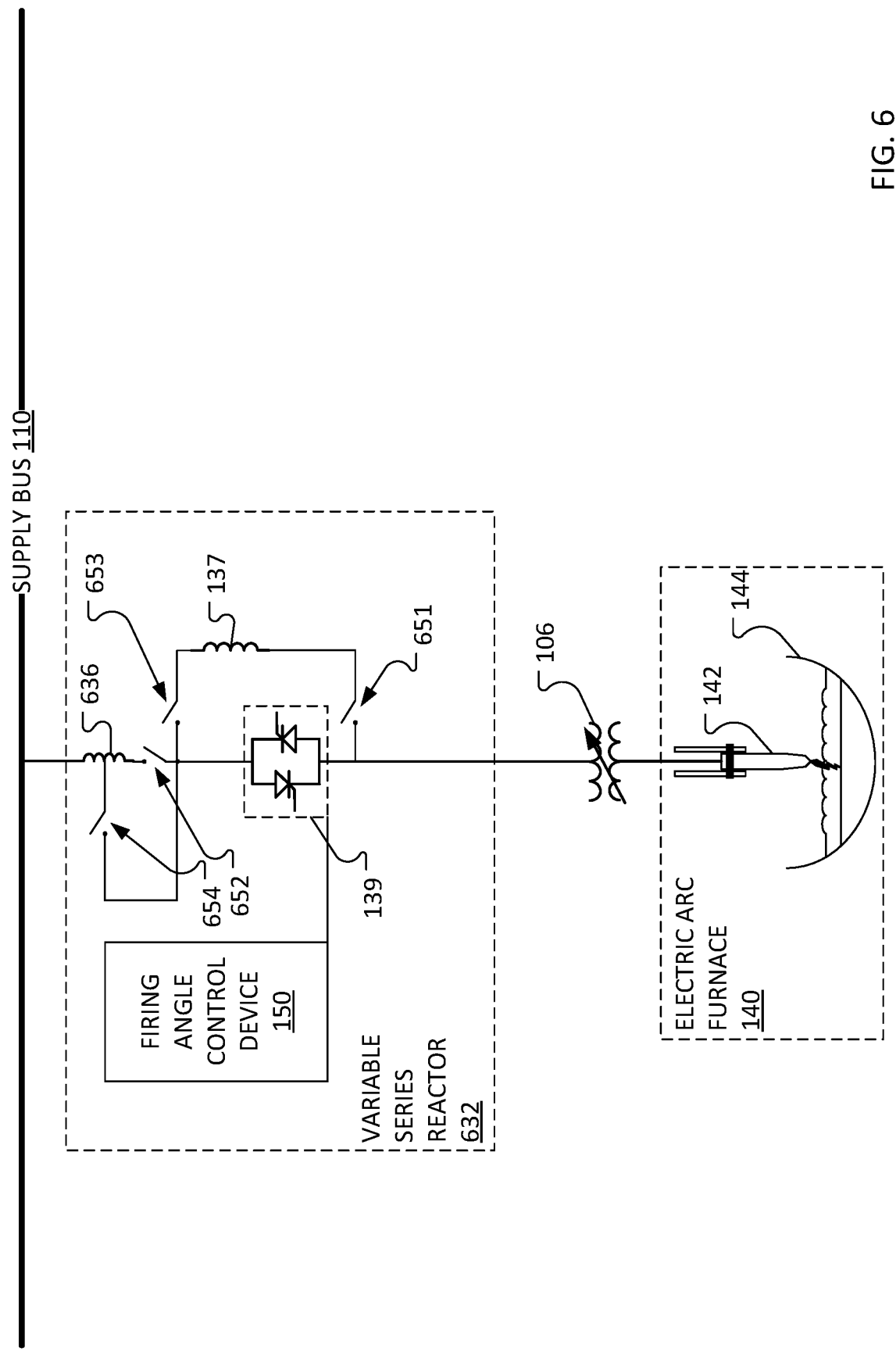
FIG. 6 illustrates the system of FIG. 1 augmented with a tapped reactor and a plurality of switches in a manner similar to the augmentation in FIG. 2, with some rearrangement of the tapped reactor and the plurality of switches relative to FIG. 2.

FIG. 6 illustrates the system of FIG. 1 augmented with a tapped reactor and a plurality of switches. As illustrated in FIG. 6, aspects of the present application relate to selectively reconfiguring a circuit between at least two circuit configurations.

In the circuit of FIG. 6, within an adapted variable series reactor 632, the reactor 137 is connected in parallel with the thyristor switch 139, as in FIG. 1. The fixed-value reactor 136 connecting the adapted variable series reactor 632 to the supply bus (see FIG. 1) has been replaced by a tapped reactor 636.

Accordingly, FIG. 6 illustrates the adapted variable series reactor 632 connected, in series with the tapped furnace transformer 106, between the electric arc furnace 140 and the supply bus 110. Each of the three phases of the adapted variable series reactor 632 (only one phase of which is illustrated) includes a switchable combination of the tapped reactor 636, the thyristor switch 139 and the reactor 137. As noted hereinbefore, each phase of the thyristor switch 139 preferably includes a pair of thyristors, or pairs of thyristor groups, arranged in opposite polarity to each other. The adapted variable series reactor 632 has a control range that is based on the switchable configuration.

The adapted variable series reactor 632 has a supply bus connection point for connecting to a phase of the supply bus 110. The adapted variable series reactor 632 also has a transformer connection point for connecting to the supply side (primary windings) of the furnace transformer 106.

The referenced switchable configuration may, in one aspect of the present application, be implemented by way of four switches.

A fixed-value-reactor-path-bottom switch 651 is positioned between the reactor 137 and the transformer connection point of the adapted variable series reactor 632.

The tapped reactor 636 has a first connection point connected to the supply bus 110, a second connection point connected to a tapped-reactor-path switch 652 and a third connection point (a selector) connected to a selector-path switch 654. The selector-path switch 654 is positioned between the selector of the tapped reactor 636 and the supply bus side of the thyristor switch 139.

A fixed-value-reactor-path-top switch 653 is positioned between the supply bus side of the thyristor switch 139 and the reactor 137.

Figure 7:
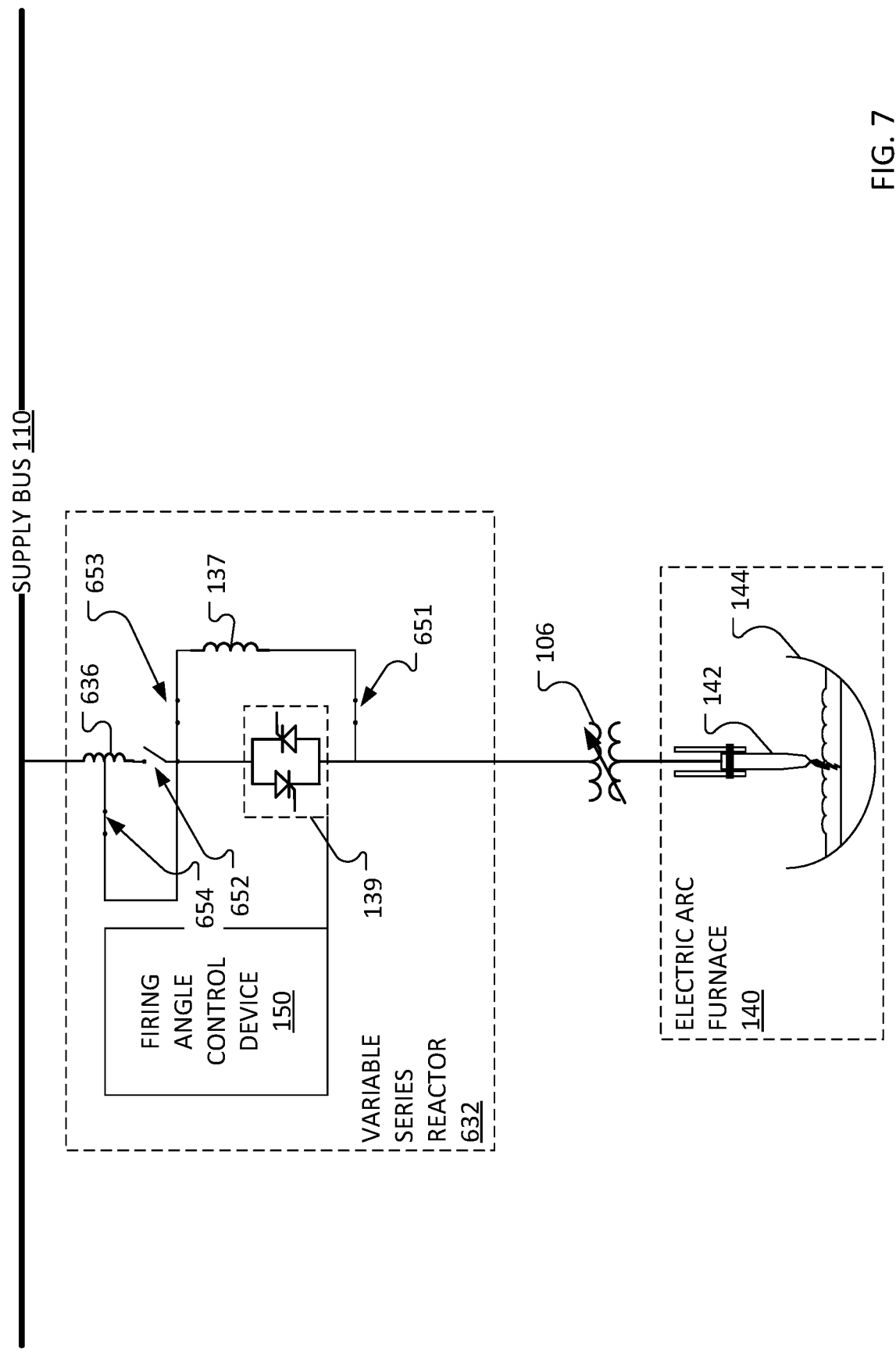
FIG. 7 illustrates the system of FIG. 6 employing a first switch configuration.

A first switch configuration for the circuit of FIG. 6, illustrated in FIG. 7, allows the adapted variable series reactor 632 to operate as a high power, high current furnace stabilizer in a manner consistent with the variable series reactor 132 of FIG. 1. In the first switch configuration, the fixed-value-reactor-path-bottom switch 651 is closed, the tapped-reactor-path switch 652 is open, the fixed-value-reactor-path-top switch 653 is closed and the selector-path switch 654 is closed. Consequently, the thyristor switch 139 operates in parallel with the reactor 137.

Figure 8:
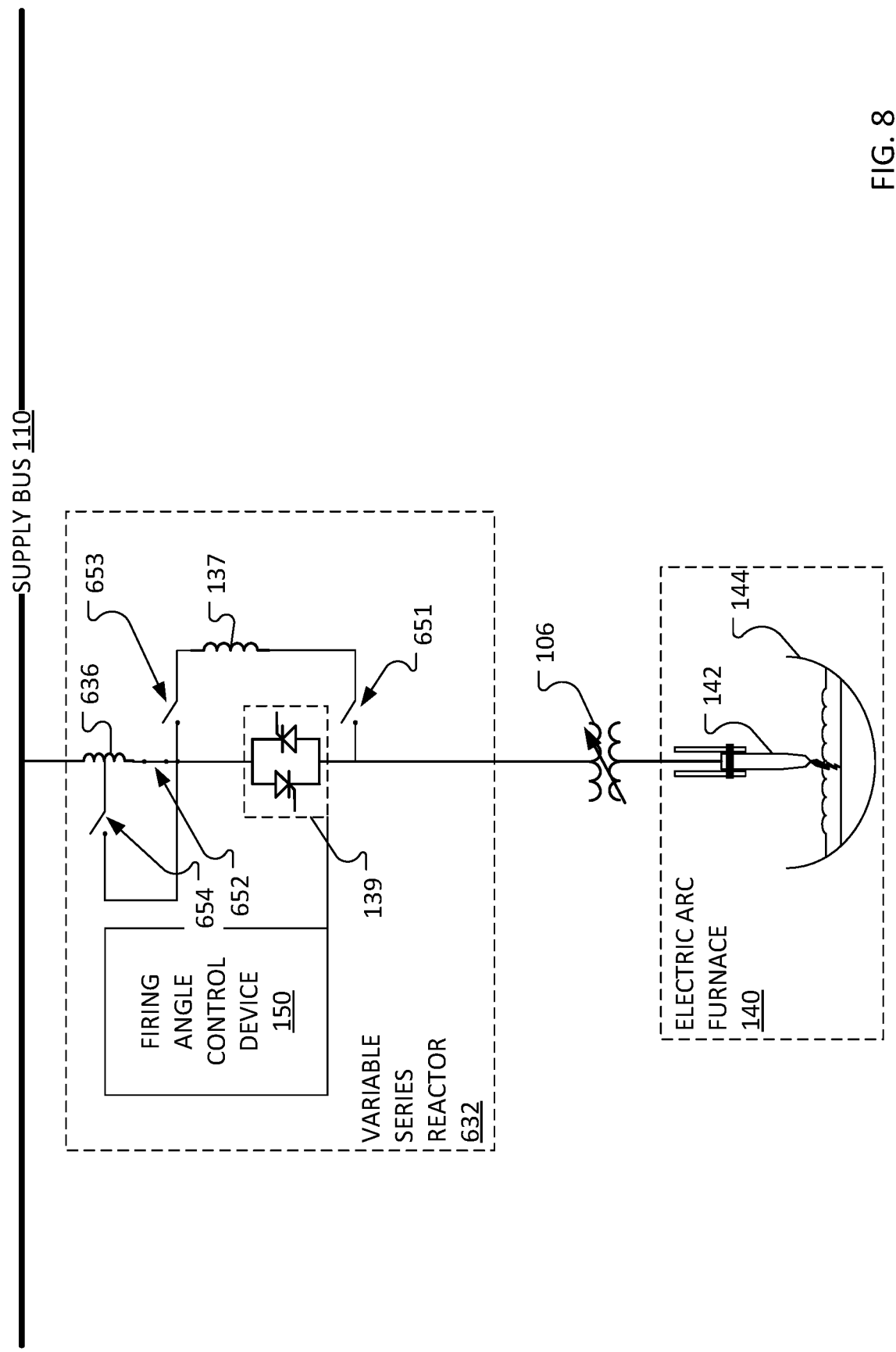
FIG. 8 illustrates the system of FIG. 6 employing a second switch configuration.

A second switch configuration for the circuit of FIG. 6, illustrated in FIG. 8, allows the adapted variable series reactor 632 to operate as a low power, low current furnace stabilizer. In the second switch configuration, the fixed-value-reactor-path-bottom switch 651 is open, the tapped-reactor-path switch 652 is closed, the fixed-value-reactor-path-top switch 653 is open and the selector-path switch 654 is open. Consequently, the thyristor switch 139 operates in series with a selected portion of the tapped reactor 636.

Recalling that FIG. 5 illustrates the system of FIG. 2 with the variable series reactor 232 on a secondary side of the furnace transformer 106, it is also notable, though not illustrated, that in contrast to the configuration of FIG. 6, the variable series reactor 632 may be placed on the secondary side of the furnace transformer 106.

Figure 9:
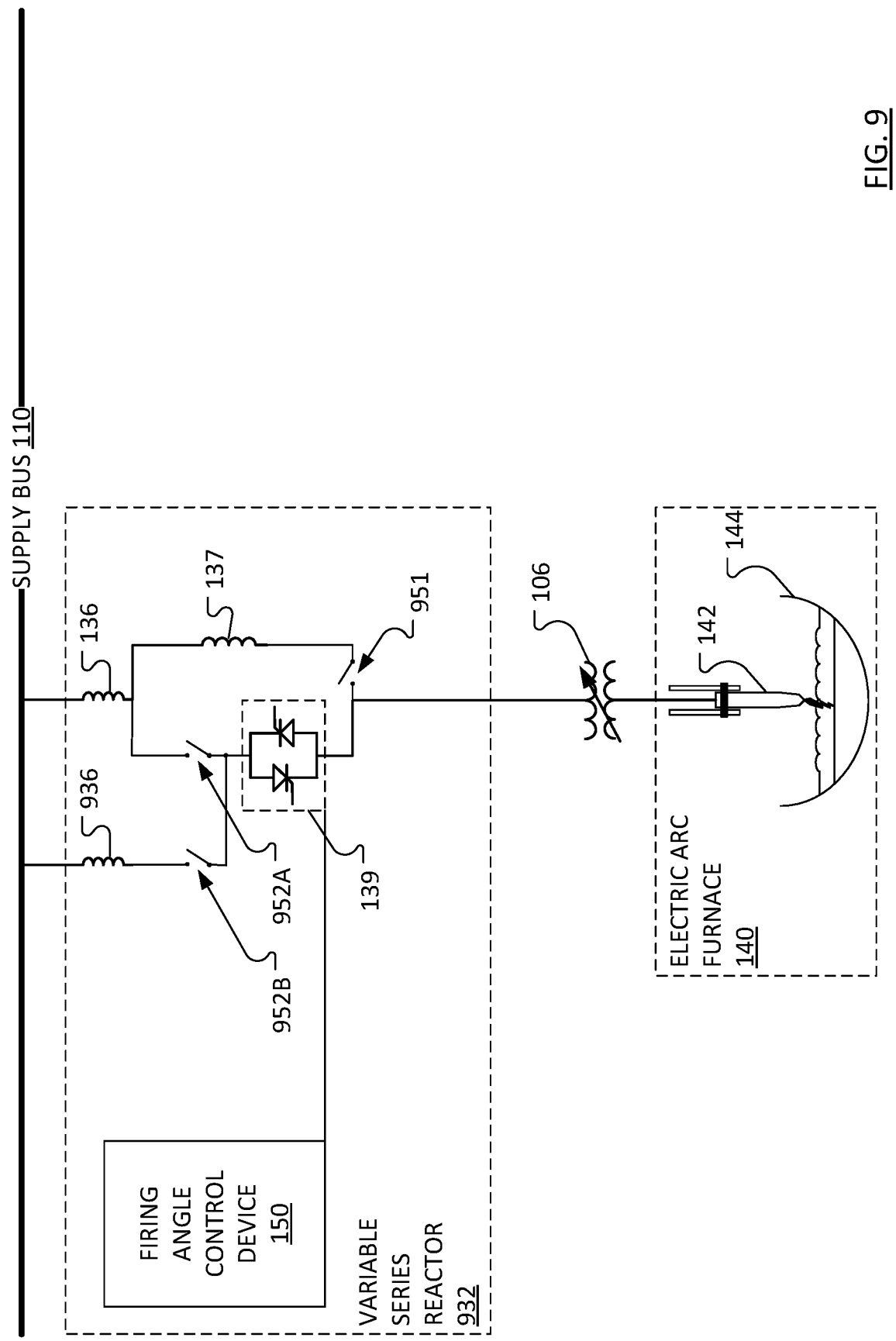
FIG. 9 illustrates the system of FIG. 1 augmented with a tapped reactor and a plurality of switches in a manner similar to the augmentation in FIG. 2, with some rearrangement of reactors and a plurality of switches relative to FIG. 2.

FIG. 9 illustrates the system of FIG. 1 augmented with a secondary reactor and a plurality of switches. As illustrated in FIG. 9, aspects of the present application relate to selectively reconfiguring a circuit between at least two circuit configurations.

In the circuit of FIG. 9, within a variable series reactor 932, the reactor 137 is connected in parallel with the thyristor switch 139, as in FIG. 1. Additionally, the fixed-value reactor 136 connecting the variable series reactor 932 to the supply bus (see FIG. 1) has been augmented by a second reactor 936.

Accordingly, FIG. 9 illustrates the adapted variable series reactor 932 connected, in series with the tapped furnace transformer 106, between the electric arc furnace 140 and the supply bus 110. Each of the three phases of the adapted variable series reactor 932 (only one phase of which is illustrated) includes a switchable combination of the first reactor 136, the second reactor 936, the thyristor switch 139 and the fixed-value reactor 137. As noted hereinbefore, each phase of the thyristor switch 139 preferably includes a pair of thyristors, or pairs of thyristor groups, arranged in opposite polarity to each other. The adapted variable series reactor 932 has a control range that is based on the switchable configuration.

The adapted variable series reactor 932 has two supply bus connection points for connecting to a phase of the supply bus 110. The adapted variable series reactor 932 also has a transformer connection point for connecting to the supply side (primary windings) of the furnace transformer 106.

The referenced switchable configuration may, in one aspect of the present application, be implemented by way of three switches.

A fixed-value-reactor-path switch 951 is positioned between the fixed-value reactor 137 and the transformer connection point of the adapted variable series reactor 932.

The first reactor 136 has a first connection point connected to the supply bus 110 and a second connection point connected to a first-reactor-path switch 952A. The first-reactor-path switch 952A is positioned between the supply bus side of the thyristor switch 139 and the first reactor 136.

The second reactor 936 has a first connection point connected to the supply bus 110 and a second connection point connected to a second-reactor-path switch 952B. The second-reactor-path switch 952B is positioned between the supply bus side of the thyristor switch 139 and the second reactor 936.

Figure 10:
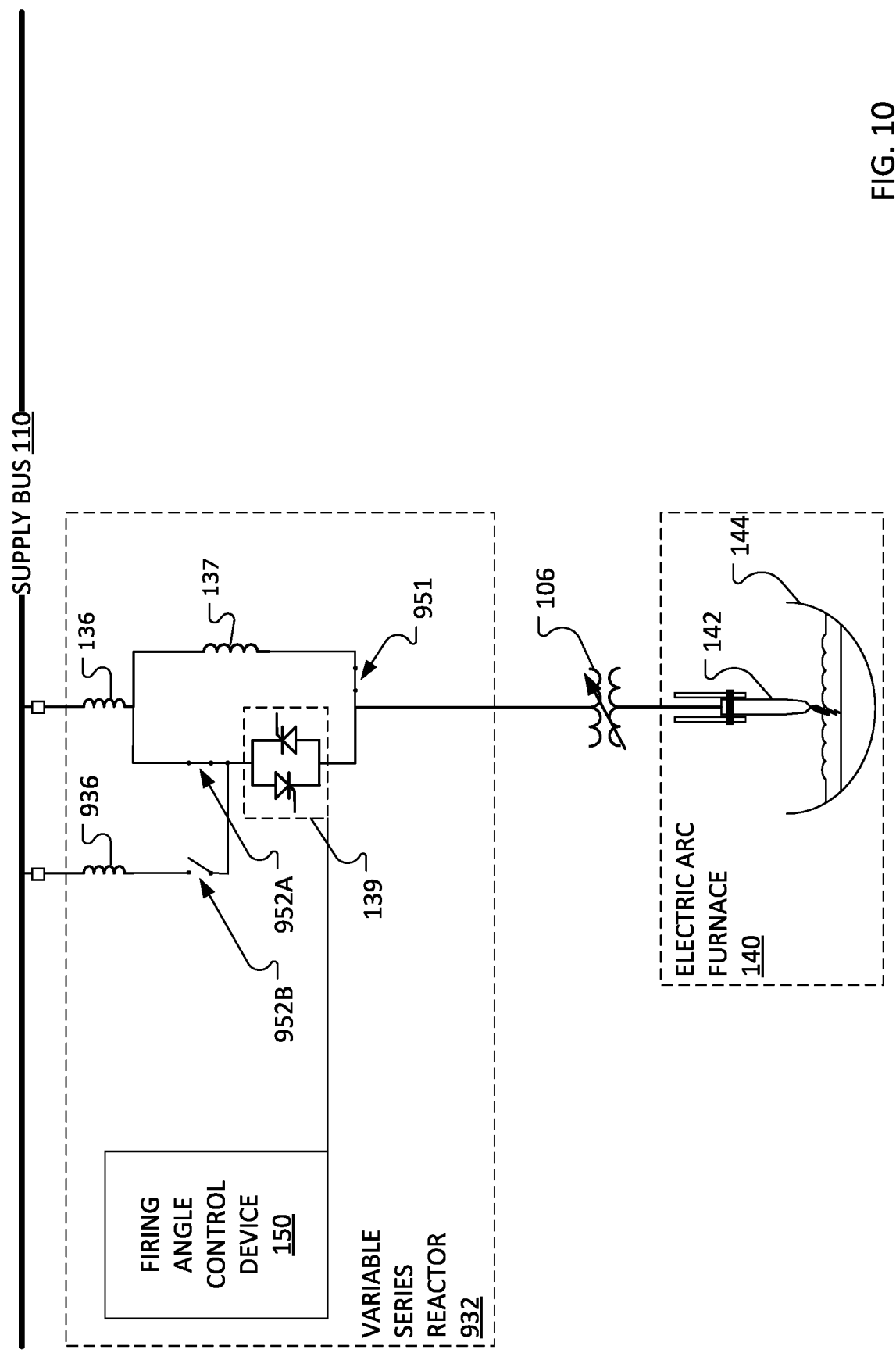
FIG. 10 illustrates the system of FIG. 9 employing a first switch configuration.

A first switch configuration for the circuit of FIG. 9, illustrated in FIG. 10, allows the adapted variable series reactor 932 to operate as a high power, high current furnace stabilizer in a manner consistent with the variable series reactor 132 of FIG. 1. In the first switch configuration, the fixed-value-reactor-path switch 951 is closed, the first-reactor-path switch 952A is closed and the second-reactor-path switch 952B is open. Consequently, the thyristor switch 139 operates in parallel with the reactor 137.

Figure 11:
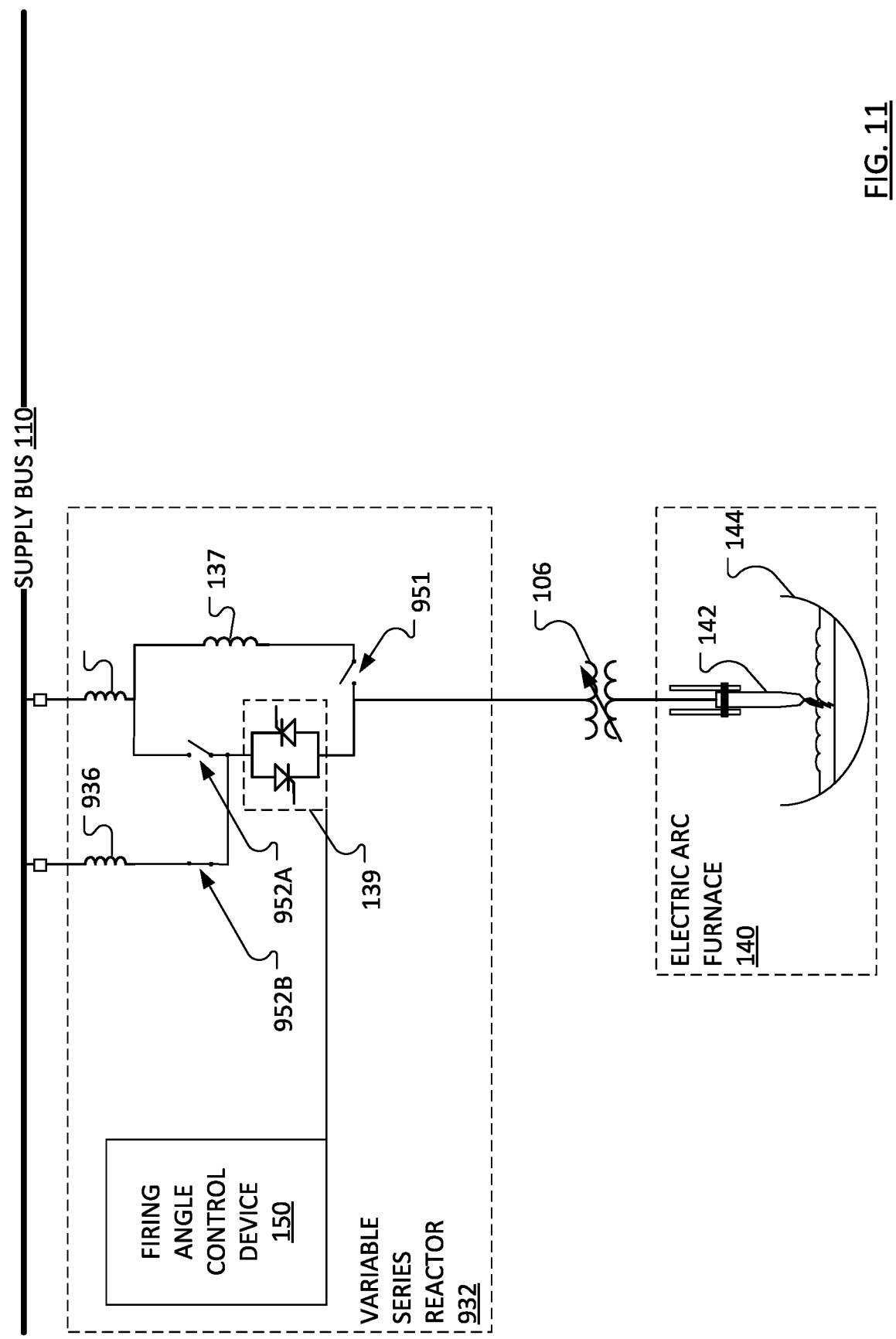
FIG. 11 illustrates the system of FIG. 9 employing a second switch configuration.

A second switch configuration for the circuit of FIG. 9, illustrated in FIG. 11, allows the adapted variable series reactor 932 to operate as a low power, low current furnace stabilizer. In the second switch configuration, the fixed-value-reactor-path switch 951 is open, the first-reactor-path switch 952A is open and the second-reactor-path switch 952B is closed. Consequently, the thyristor switch 139 operates in series with the second reactor 936.

Recalling that FIG. 5 illustrates the system of FIG. 2 with the variable series reactor 232 on a secondary side of the furnace transformer 106, it is also notable, though not illustrated, that in contrast to the configuration of FIG. 9, the variable series reactor 932 may be placed on the secondary side of the furnace transformer 106.

Figure 12:
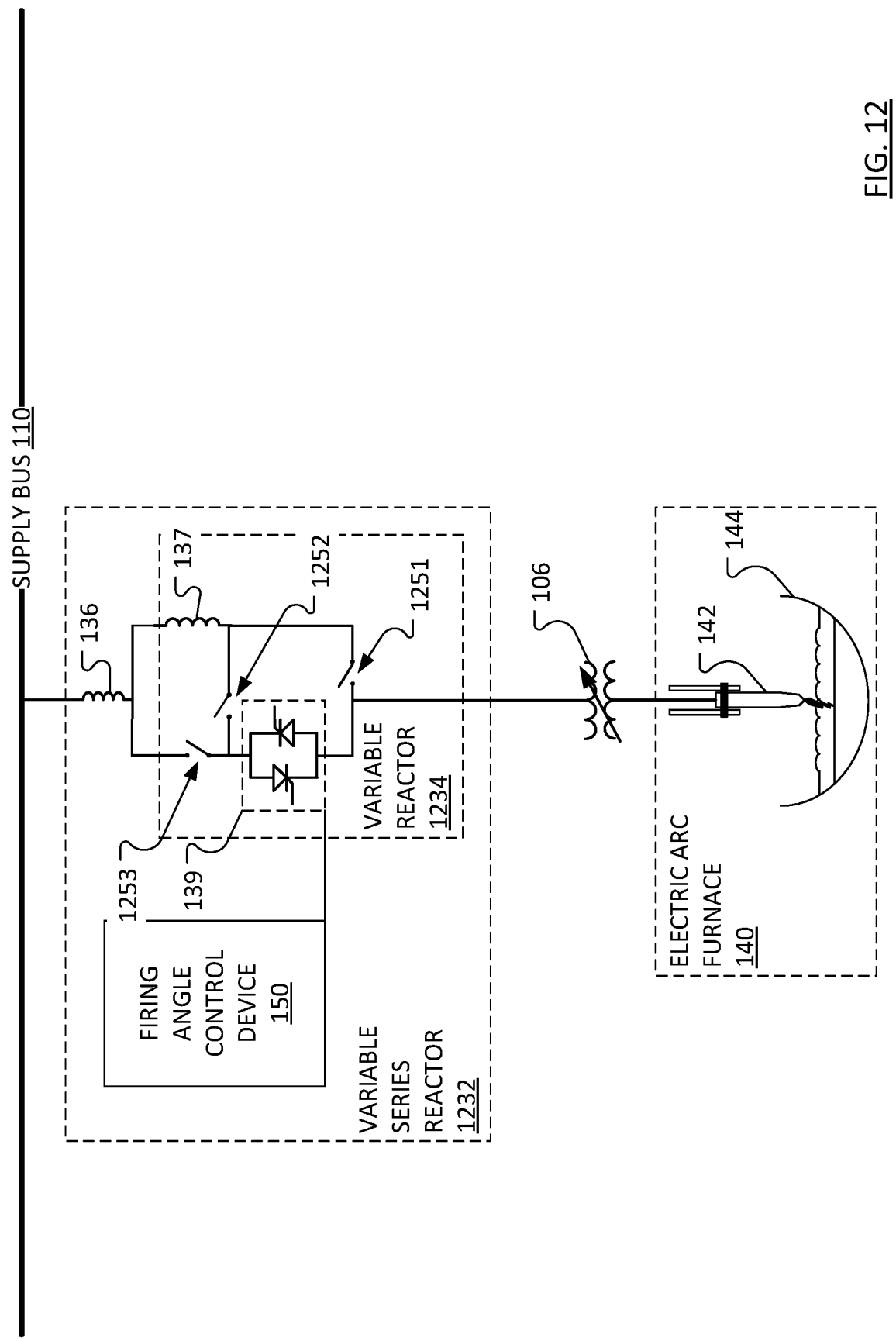
FIG. 12 illustrates the system of FIG. 1 augmented with a plurality of switches.

FIG. 12 illustrates the system of FIG. 1 augmented with a plurality of switches. As illustrated in FIG. 12, aspects of the present application relate to selectively reconfiguring the circuit of FIG. 1 to a high impedance circuit configuration. In part, the circuit illustrated in FIG. 12 may be distinguished from the circuit illustrated in FIG. 2 in that the reactor in the circuit illustrated in FIG. 12 not a tapped reactor.

In the circuit of FIG. 12, the switches allow the reactor 137 to be selectively connected in parallel or in series with the thyristor switch 139.

Accordingly, FIG. 12 illustrates an adapted variable series reactor 1232 connected, in series with the tapped furnace transformer 106, between the electric arc furnace 140 and the supply bus 110. Each of the three phases of the adapted variable series reactor 1232 (only one phase of which is illustrated) includes a series combination of an adapted variable reactor 1234 and the fixed-value reactor 136 connecting a respective phase of a supply side (primary windings) of the furnace transformer 106 to a corresponding phase of the supply bus 110. In the illustrated embodiment, the representative adapted variable reactor 1234 includes the reactor 137 connected in a switchable configuration with the thyristor switch 139. As noted hereinbefore, each phase of the thyristor switch 139 preferably includes a pair of thyristors, or pairs of thyristor groups, arranged in opposite polarity to each other. The adapted variable series reactor 1232 has a control range that is based on the switchable configuration.

The adapted variable series reactor 1232 has a supply bus connection point for connecting to a phase of the supply bus 110. The adapted variable series reactor 1232 also has a transformer connection point for connecting to the supply side (primary windings) of the furnace transformer 106.

The referenced switchable configuration may, in one aspect of the present application, be implemented by way of three switches added to the adapted variable reactor 1234.

The reactor 137 has an upper end connected to the end of the fixed-value reactor 136 that is not connected to the supply bus 110. The reactor 137 has a lower end. A lower switch 1251 is positioned between the lower end of the reactor 137 and the transformer connection point of the adapted variable series reactor 1232.

A middle switch 1252 is positioned between the lower end of the reactor 137 and the supply bus side of the thyristor switch 139.

A thyristor-path switch 1253 is positioned between the supply bus side of the thyristor switch 139, where the middle switch 1252 attaches, and the fixed-value reactor 136.

Figure 13:
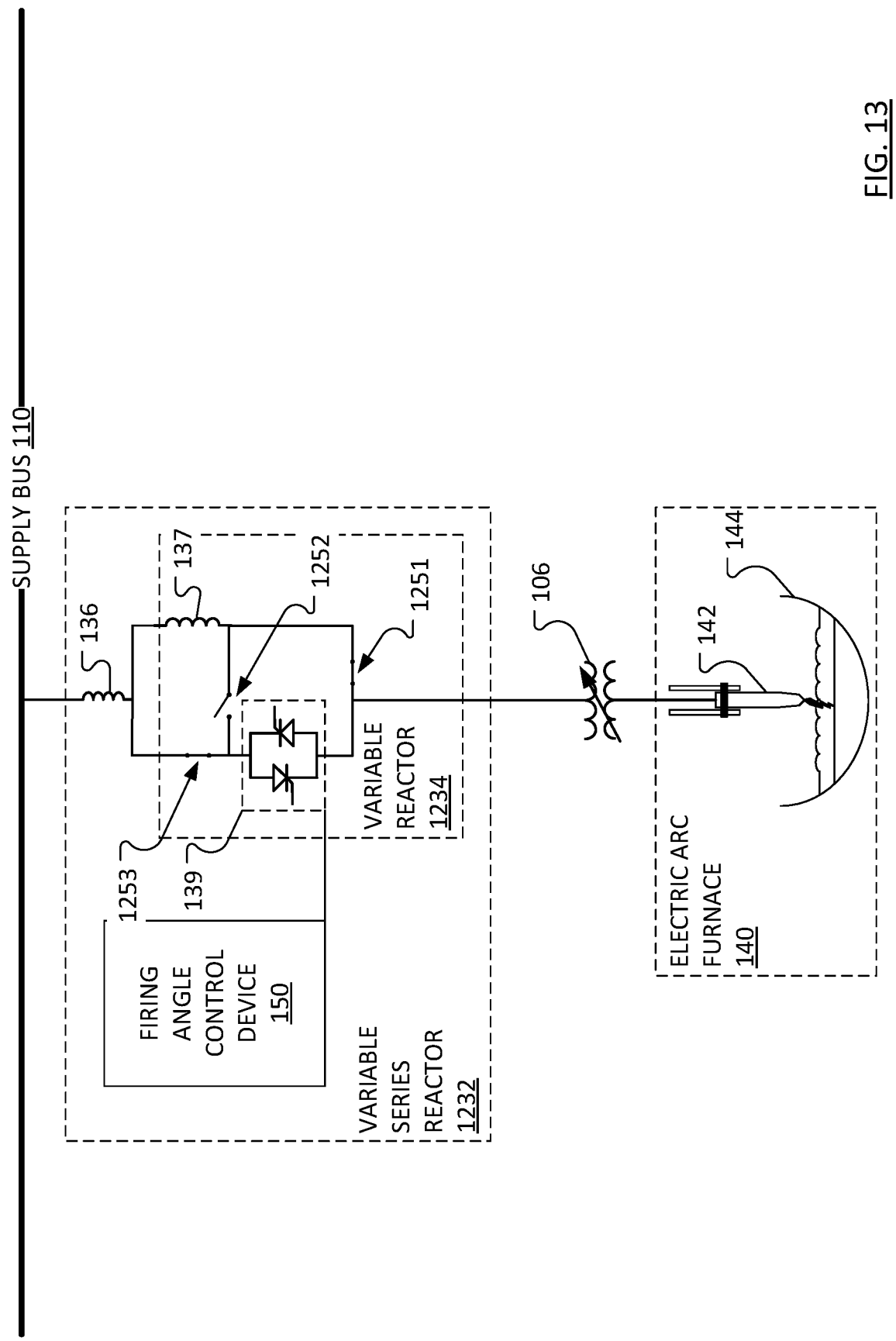
FIG. 13 illustrates the system of FIG. 12 employing a first switch configuration.

A first switch configuration, illustrated in FIG. 13, allows the adapted variable series reactor 1232 to operate as a high power, high current furnace stabilizer in a manner consistent with the variable series reactor 132 of FIG. 1. In the first switch configuration, the lower switch 1251 is closed, the middle switch 1252 is open and the thyristor-path switch 1253 is closed. Consequently, the thyristor switch 139 operates in parallel with the reactor 137.

Figure 14:
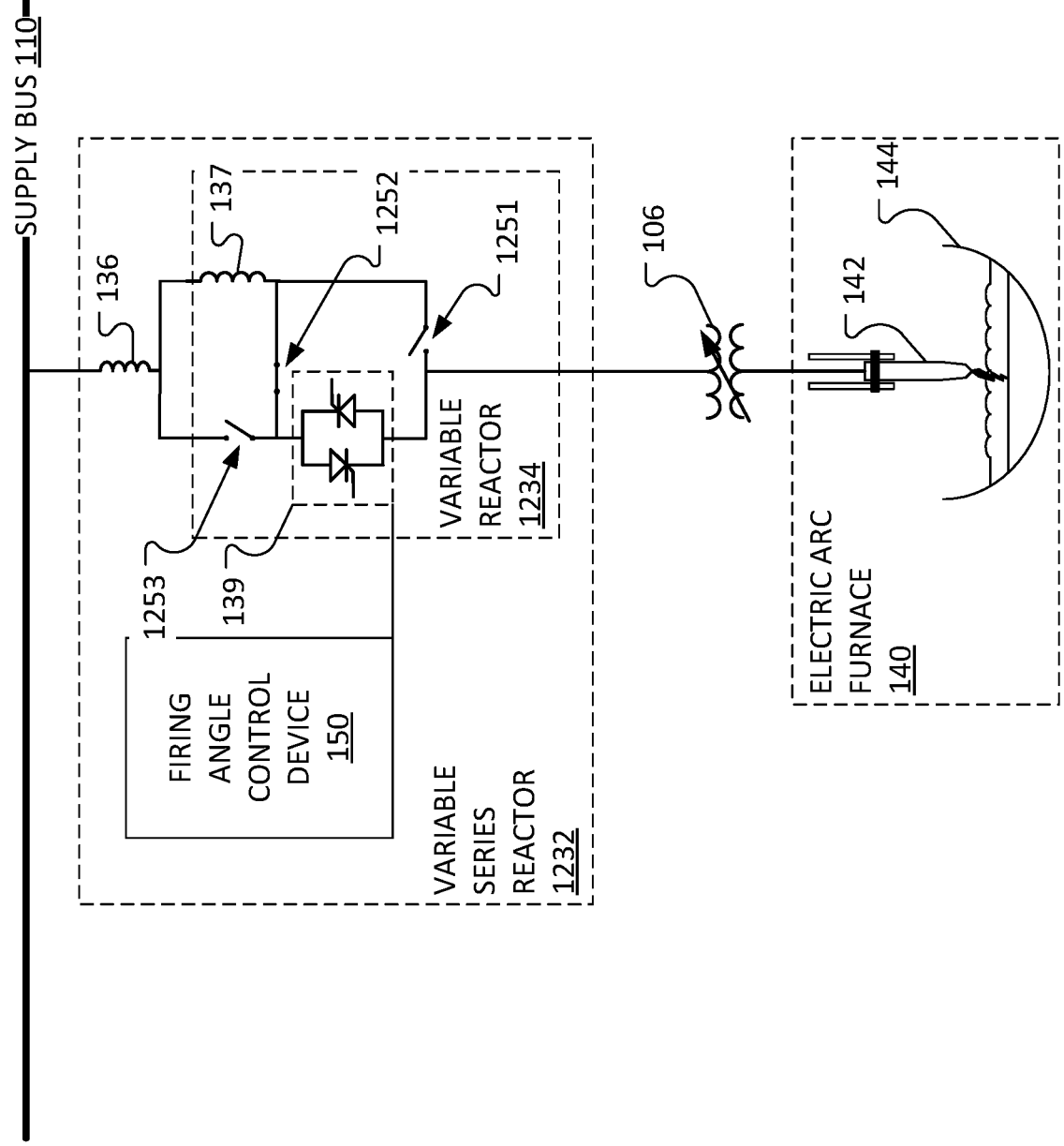
FIG. 14 illustrates the system of FIG. 12 employing a second switch configuration.

A second switch configuration, illustrated in FIG. 14, allows the adapted variable series reactor 1232 to operate as a low power, low current furnace stabilizer. In the second switch configuration, the lower switch 1251 is open, the middle switch 1252 is closed and the thyristor-path switch 1253 is open. Consequently, the thyristor switch 139 operates in series with the reactor 137 and the fixed-value reactor 136.

Figure 15:
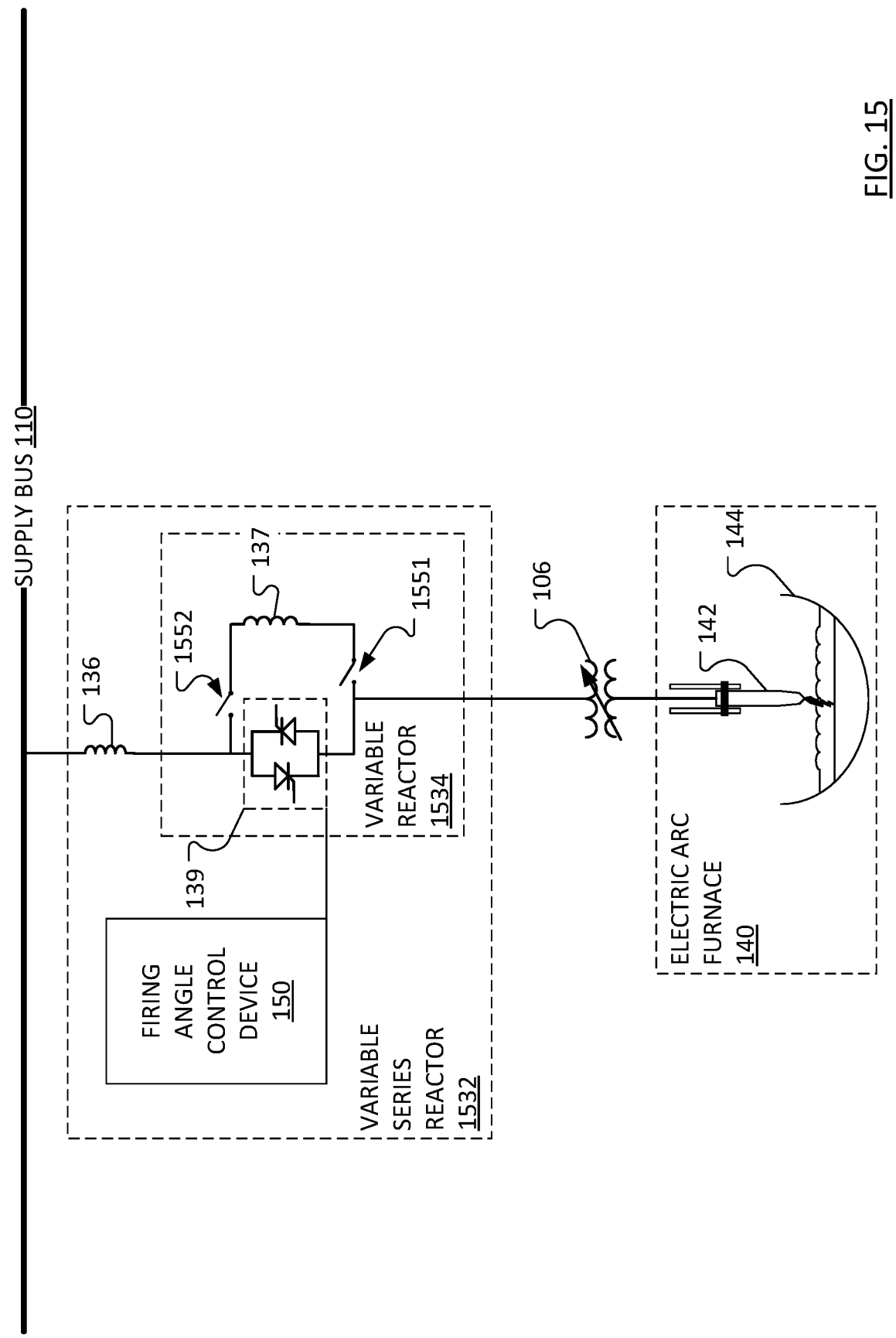
FIG. 15 illustrates the system of FIG. 1 augmented with a plurality of switches.

FIG. 15 illustrates the system of FIG. 1 augmented with a plurality of switches. As illustrated in FIG. 15, aspects of the present application relate to selectively reconfiguring the circuit of FIG. 1 to a high impedance circuit configuration. In part, the circuit illustrated in FIG. 15 may be distinguished from the circuit illustrated in FIG. 2 in that the reactor in the circuit illustrated in FIG. 15 not a tapped reactor.

In the circuit of FIG. 15, the switches allow the reactor 137 to be selectively connected in parallel with the thyristor switch 139 or not connected to the circuit at all.

Accordingly, FIG. 15 illustrates an adapted variable series reactor 1532 connected, in series with the tapped furnace transformer 106, between the electric arc furnace 140 and the supply bus 110. Each of the three phases of the adapted variable series reactor 1532 (only one phase of which is illustrated) includes a series combination of an adapted variable reactor 1234 and the fixed-value reactor 136 connecting a respective phase of a supply side (primary windings) of the furnace transformer 106 to a corresponding phase of the supply bus 110. In the illustrated embodiment, the representative adapted variable reactor 1534 includes the reactor 137 connected in a switchable configuration with the thyristor switch 139. As noted hereinbefore, each phase of the thyristor switch 139 preferably includes a pair of thyristors, or pairs of thyristor groups, arranged in opposite polarity to each other. The adapted variable series reactor 1532 has a control range that is based on the switchable configuration.

The adapted variable series reactor 1532 has a supply bus connection point for connecting to a phase of the supply bus 110. The adapted variable series reactor 1532 also has a transformer connection point for connecting to the supply side (primary windings) of the furnace transformer 106.

The referenced switchable configuration may, in one aspect of the present application, be implemented by way of three switches added to the adapted variable reactor 1534.

The reactor 137 has an upper end and a lower end.

An upper switch 1552 is positioned between the upper end of the reactor 137 and the supply bus side of the thyristor switch 139. A lower switch 1551 is positioned between the lower end of the reactor 137 and the transformer connection point of the adapted variable series reactor 1532.

Figure 16:
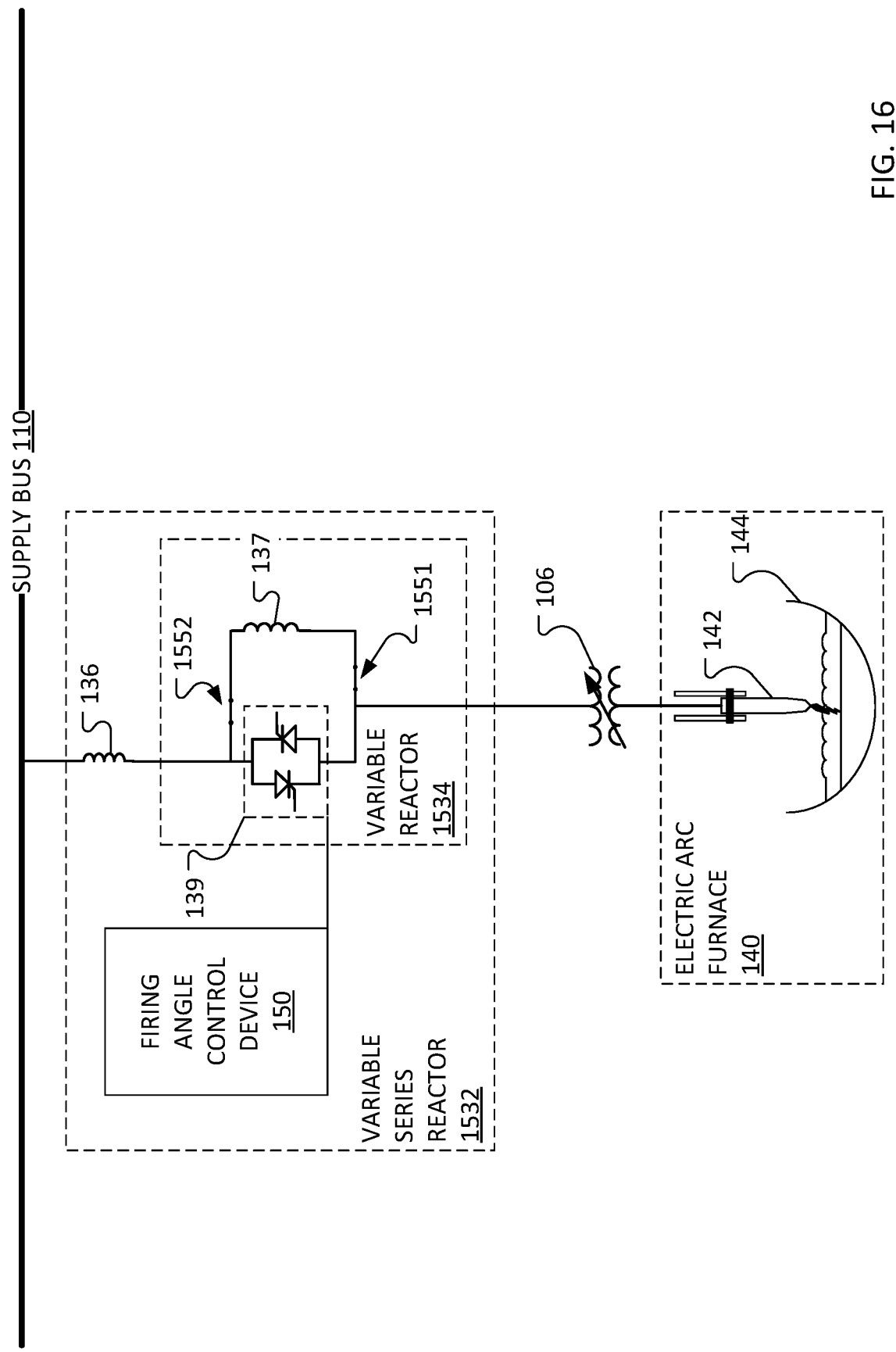
FIG. 16 illustrates the system of FIG. 15 employing a first switch configuration.

A first switch configuration, illustrated in FIG. 16, allows the adapted variable series reactor 1532 to operate as a high power, high current furnace stabilizer in a manner consistent with the variable series reactor 132 of FIG. 1. In the first switch configuration, the lower switch 1551 is closed and the upper switch 1552 is also closed. Consequently, the thyristor switch 139 operates in parallel with the reactor 137.

A second switch configuration, illustrated in FIG. 15, allows the adapted variable series reactor 1532 to operate as a low power, low current furnace stabilizer. In the second switch configuration, the lower switch 1551 is open and the upper switch 1552 is open. Consequently, the thyristor switch 139 operates in series with the reactor 137 and the fixed-value reactor 136.

Figure 17:
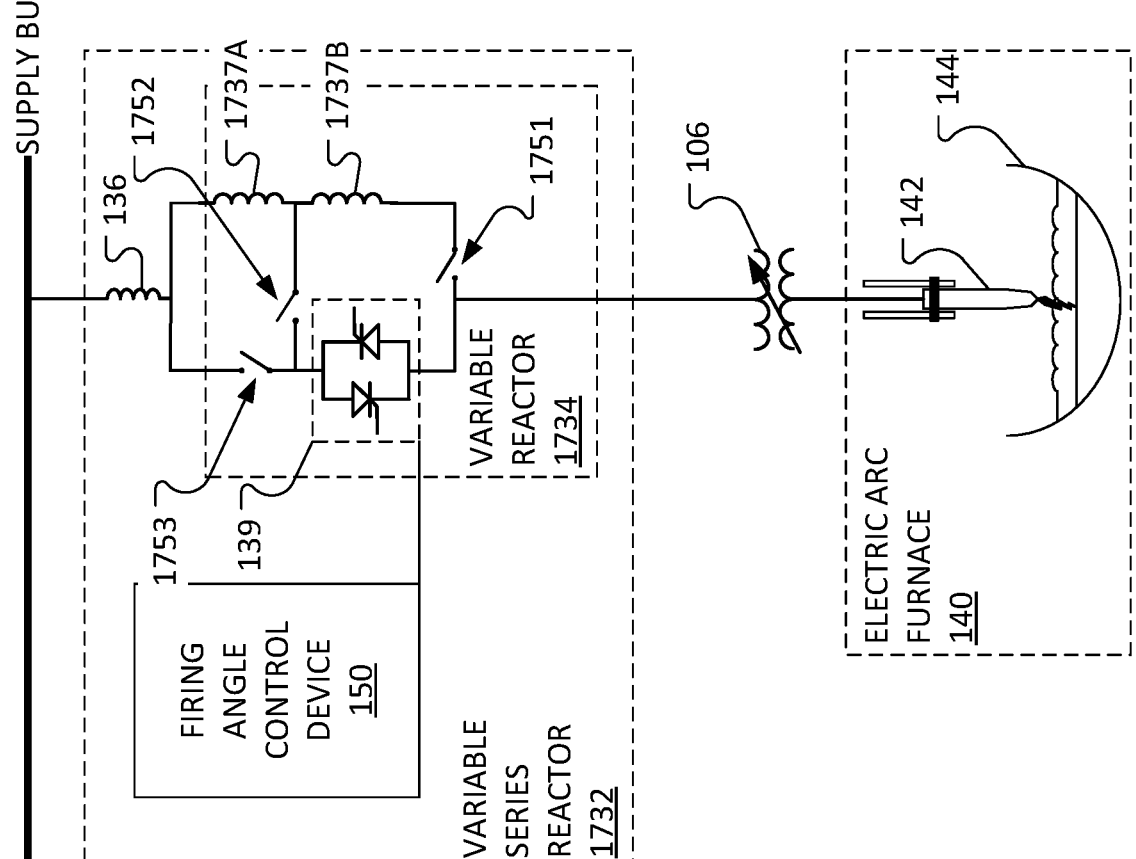
FIG. 17 illustrates the system of FIG. 1 augmented with a pair of reactors and a plurality of switches.

FIG. 17 illustrates the system of FIG. 1 augmented with a plurality of switches. As illustrated in FIG. 17, aspects of the present application relate to selectively reconfiguring the circuit of FIG. 1 to a high impedance circuit configuration. In part, the circuit illustrated in FIG. 17 may be distinguished from the circuit illustrated in FIG. 2 in that in place of the tapped reactor 237, the circuit illustrated in FIG. 17 uses a pair of reactors.

In the circuit of FIG. 17, the switches allow a pair of reactors 1737A, 1737B to be selectively connected as a series combination of reactors 1737A, 17376 in parallel with the thyristor switch 139 or a selected one of the pair of reactors 1737A, 17376 in series with the thyristor switch 139.

Accordingly, FIG. 17 illustrates an adapted variable series reactor 1732 connected, in series with the tapped furnace transformer 106, between the electric arc furnace 140 and the supply bus 110. Each of the three phases of the adapted variable series reactor 1732 (only one phase of which is illustrated) includes a series combination of an adapted variable reactor 1734 and the fixed-value reactor 136 connecting a respective phase of a supply side (primary windings) of the furnace transformer 106 to a corresponding phase of the supply bus 110. In the illustrated embodiment, the representative adapted variable reactor 1734 includes the pair of reactors 1737A, 1737B connected in a switchable configuration with the thyristor switch 139. As noted hereinbefore, each phase of the thyristor switch 139 preferably includes a pair of thyristors, or pairs of thyristor groups, arranged in opposite polarity to each other. The adapted variable series reactor 1732 has a control range that is based on the switchable configuration.

The adapted variable series reactor 1732 has a supply bus connection point for connecting to a phase of the supply bus 110. The adapted variable series reactor 1732 also has a transformer connection point for connecting to the supply side (primary windings) of the furnace transformer 106.

The referenced switchable configuration may, in one aspect of the present application, be implemented by way of three switches added to the adapted variable reactor 1734.

The pair of reactors 1737A, 17376 may be considered to include a first reactor 1737A and a second reactor 17376.

The first reactor 1737A has an upper end connected to the end of the fixed-value reactor 136 that is not connected to the supply bus 110. The first reactor 1737A has a lower end.

A middle switch 1752 is positioned between the lower end of the first reactor 1737A and the supply bus side of the thyristor switch 139.

The second reactor 17376 has an upper end, connected to the lower end of the first reactor 1737A, and a lower end. A lower switch 1751 is positioned between the lower end of the second reactor 17376 and the transformer connection point of the adapted variable series reactor 1732.

A thyristor-path switch 1753 is positioned between the supply bus side of the thyristor switch 139, where the middle switch 1752 attaches, and the fixed-value reactor 136.

Figure 18:
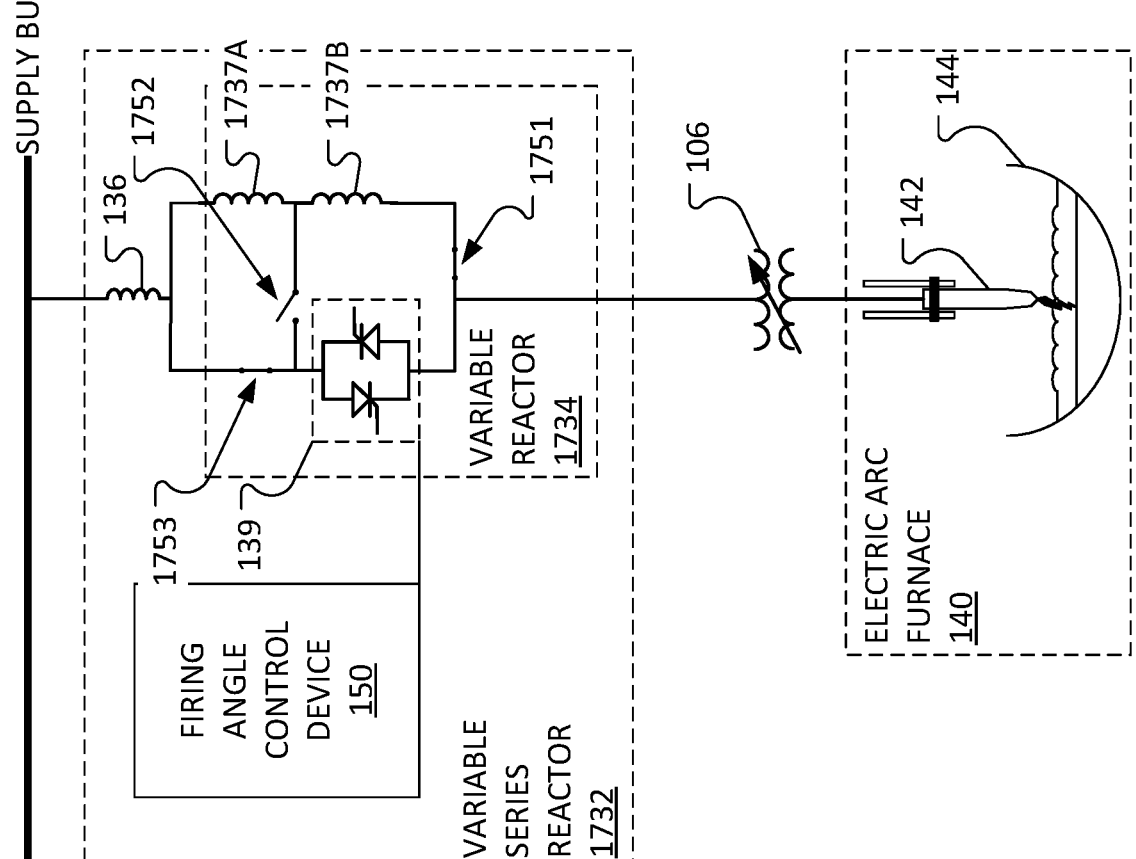
FIG. 18 illustrates the system of FIG. 17 employing a first switch configuration.

A first switch configuration, illustrated in FIG. 18, allows the adapted variable series reactor 1732 to operate as a high power, high current furnace stabilizer in a manner consistent with the variable series reactor 132 of FIG. 1. In the first switch configuration, the lower switch 1751 is closed, the middle switch 1752 is open and the thyristor-path switch 1753 is closed. Consequently, the thyristor switch 139 operates in parallel with a series combination of the first reactor 1737A and the second reactor 1737B.

Figure 19:
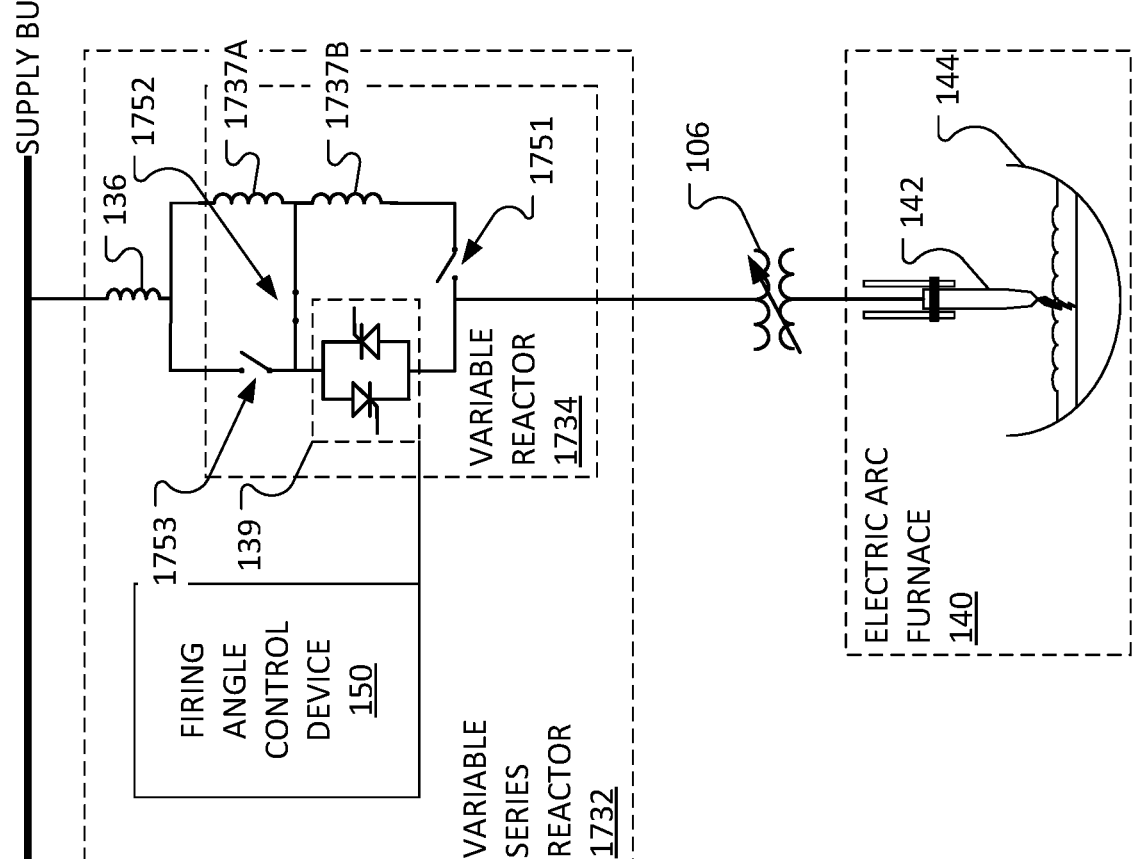
FIG. 19 illustrates the system of FIG. 17 employing a second switch configuration.

A second switch configuration, illustrated in FIG. 19, allows the adapted variable series reactor 1732 to operate as a low power, low current furnace stabilizer. In the second switch configuration, the lower switch 1751 is open, the middle switch 1752 is closed and the thyristor-path switch 1753 is open. Consequently, the thyristor switch 139 operates in series with the first reactor 1737A and the fixed-value reactor 136.

Recalling that FIG. 5 illustrates the system of FIG. 2 with the variable series reactor 232 on a secondary side of the furnace transformer 106, it is also notable, though not illustrated, that in contrast to the configuration of FIGS. 9, 12, 15 and 17, the variable series reactors 932, 1232, 1532, 1732 may be placed on the secondary side of the furnace transformer 106.

The above-described implementations of the present application are intended to be examples only. Alterations, modifications and variations may be effected to the particular implementations by those skilled in the art without departing from the scope of the application, which is defined by the claims appended hereto.

What is claimed is:

1. A line control circuit comprising:
   a supply-side connection point for connecting to an electrical supply;
   a load-side connection point for connecting to a load;
   a thyristor switch;
   a first reactance;
   a second reactance; and
   a plurality of switches for providing electrical connection of the thyristor switch to the electrical supply and to the load, wherein each switch, independently, is configured for disposition in either a closed condition or an open condition;
   wherein the plurality of switches are configurable in and allow for switching between:
      a first configuration wherein the plurality of switches are disposed such that:
         the thyristor switch is disposed in a parallel combination with the first reactance; and
         the parallel combination of the thyristor switch and the first reactance is disposed in series with the second reactance;
      and
      a second configuration wherein the plurality of switches are disposed such that:
         the parallel combination of the thyristor switch and the first reactance is defeated; and
         the thyristor switch is disposed in series with a third reactance.

2. The line control circuit of claim 1 wherein the load comprises an electric arc furnace.

3. The line control circuit of claim 2 wherein the electric arc furnace comprises three electrodes.

4. The line control circuit of claim 3 wherein the electric arc furnace comprises six electrodes.

5. The line control circuit of claim 2 wherein the first configuration provides a relatively high power and relatively high current furnace stabilizer.

6. The line control circuit of claim 1 wherein the first reactance is provided by a first reactor.

7. The line control circuit of claim 6 wherein the second reactance is provided by a second reactor.

8. The line control circuit of claim 7 wherein the third reactance is provided by a combination of at least a portion of the first reactor and at least a portion of the second reactor.

9. The line control circuit of claim 7 wherein the third reactance is provided by a third reactor independent of the first reactor and the second reactor.

10. The line control circuit of claim 7 wherein the third reactance is provided by the second reactor.

11. The line control circuit of claim 7 wherein the third reactance is provided by a serial combination of the first reactor and the second reactor.

12. An adapted variable series reactor comprising:
   a supply bus connection point for connecting to a phase of a supply bus having a plurality of phases;
   a transformer connection point for connecting to a transformer for an electrical load;
   a fixed-value reactor connected, at a first fixed-value reactor end, to the supply bus connection point, the fixed-value reactor having a second fixed-value reactor end;
   a thyristor-path switch connected, at a first thyristor-path switch end, to the second fixed-value reactor end, the thyristor-path switch having a second thyristor-path switch end;
   a thyristor switch connected, at a first thyristor switch end, to the second thyristor-path switch end, the thyristor switch having a second thyristor switch end connected to the transformer connection point;
   a tapped reactor connected, at a first tapped reactor end, to the second fixed-value reactor end, the tapped reactor having a second tapped reactor end and a tapped reactor selector;
   a tapped-reactor-path switch connected between the second tapped reactor end and the transformer connection point; and a selector-path switch connected, at a first selector-path switch end, to the tapped reactor selector and, a second selector-path switch end, to the first thyristor switch end;

the adapted variable series reactor having a first configuration defined by:
  the selector-path switch being an open state;
  the tapped-reactor-path switch being a closed state; and
  the thyristor-path switch being in a closed state; and the adapted variable series reactor having a second configuration defined by:
  the selector-path switch being a closed state;
  the tapped-reactor-path switch being an open state; and
  the thyristor-path switch being in an open state.

13. The adapted variable series reactor of claim 12 wherein the load comprises an electric arc furnace.

14. The adapted variable series reactor of claim 13 wherein the electric arc furnace comprises three electrodes.

15. The adapted variable series reactor of claim 14 wherein the electric arc furnace comprises six electrodes.

16. The adapted variable series reactor of claim 13 wherein the first configuration provides a relatively high power and relatively high current furnace stabilizer.

17. The adapted variable series reactor of claim 12 wherein the second configuration provides a relatively low power and relatively low current furnace startup and idling mechanism.

18. The adapted variable series reactor of claim 12 further comprising a firing angle control device adapted to control a firing angle for thyristors in the thyristor switch.

19. An adapted variable series reactor comprising:
  a supply bus connection point for connecting to a phase of a supply bus having a plurality of phases;
  a transformer connection point for connecting to a transformer for an electrical load;
  a fixed-value reactor connected, at a first fixed-value reactor end, to the supply bus connection point, the fixed-value reactor having a second fixed-value reactor end;
  a thyristor-path switch connected, at a first thyristor-path switch end, to the second fixed-value reactor end, the thyristor-path switch having a second thyristor-path switch end;
  a thyristor switch connected, at a first thyristor switch end, to the second thyristor-path switch end, the thyristor switch having a second thyristor switch end connected to the transformer connection point;
  a further reactor connected, at a first further reactor end, to the second fixed-value reactor end, the further reactor having a second further reactor end;
  a lower switch connected between the second further reactor end and the transformer connection point; and
  a middle switch connected, at a first middle switch end, to the second further reactor end and, at a second middle switch end, to the first thyristor switch end;

the adapted variable series reactor having a first configuration defined by:
  the middle switch being an open state;
  the lower switch being a closed state; and
  the thyristor-path switch being in a closed state; and the adapted variable series reactor having a second configuration defined by:
  the middle switch being a closed state;
  the lower switch being an open state; and
  the thyristor-path switch being in an open state.

* * * * *